US010483496B2

(12) United States Patent
Wu et al.

(10) Patent No.: US 10,483,496 B2
(45) Date of Patent: Nov. 19, 2019

(54) ELECTROLUMINESCENT DEVICES WITH IMPROVED OPTICAL OUT-COUPLING EFFICIENCIES

(71) Applicant: National Taiwan University, Taipei (TW)

(72) Inventors: Chung-Chih Wu, Taipei (TW); Chun-Yu Lin, Taipei (TW); Wei-Kai Lee, Taipei (TW); Min Jiao, Taipei (TW); Hoang Yan Lin, Taipei (TW); Guo-Dong Su, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/668,894

(22) Filed: Aug. 4, 2017

(65) Prior Publication Data

US 2017/0358779 A1 Dec. 14, 2017

Related U.S. Application Data

(62) Division of application No. 15/066,515, filed on Mar. 10, 2016, now abandoned.

(60) Provisional application No. 62/177,273, filed on Mar. 11, 2015.

(51) Int. Cl.
*H01L 51/52* (2006.01)
*H01L 27/32* (2006.01)
*H01L 33/60* (2010.01)

(52) U.S. Cl.
CPC ......... *H01L 51/5271* (2013.01); *H01L 27/32* (2013.01); *H01L 27/3246* (2013.01); *H01L 33/60* (2013.01); *H01L 51/5268* (2013.01); *H01L 2251/558* (2013.01)

(58) Field of Classification Search
CPC .......... H01L 2251/558; H01L 27/3246; H01L 27/5268; H01L 33/60; H01L 33/20; H01L 33/62; H01L 33/54; H01L 33/58; H01L 51/5268
USPC ........ 257/40, 91, 98, 99, E33.056, E33.068; 438/22, 25, 26, 82, 99
See application file for complete search history.

(56) References Cited

U.S. PATENT DOCUMENTS

| 6,576,930 B2 | 6/2003 | Reeh et al. |
| 6,791,259 B1 | 9/2004 | Stokes et al. |
| 2005/0072980 A1* | 4/2005 | Ludowise ............... H01L 33/60 257/79 |
| 2007/0120135 A1* | 5/2007 | Soules .................. H01L 33/507 257/98 |

(Continued)

FOREIGN PATENT DOCUMENTS

CN 1882208 12/2006

*Primary Examiner* — Thinh T Nguyen
(74) *Attorney, Agent, or Firm* — WPAT, PC

(57) ABSTRACT

An electroluminescent (EL) device is disclosed. An optically reflective concave structure includes a first surface and a second surface that lies at an angle relative to the first surface, wherein at least the first and second surfaces are optically reflective. One or more functional layers include a light emitting layer, disposed over the surfaces of the optically reflective concave structure, wherein at least one electroluminescent area of the light emitting layer is defined on the first surface. Especially, the ratio between the diameter of the first surface and the thickness of the one or more functional layers in the optically reflective concave structure is smaller than a constant value.

22 Claims, 32 Drawing Sheets

(56) References Cited

U.S. PATENT DOCUMENTS

| | | | |
|---|---|---|---|
| 2008/0030132 A1 | 2/2008 | Adachi et al. | |
| 2010/0181582 A1* | 7/2010 | Li | H01L 33/44 257/91 |
| 2011/0001157 A1* | 1/2011 | McKenzie | H01L 33/507 257/98 |
| 2011/0279998 A1 | 11/2011 | Su et al. | |
| 2012/0007119 A1* | 1/2012 | Shiobara | H01L 33/44 257/98 |
| 2013/0270587 A1 | 10/2013 | Ouderkirk et al. | |
| 2014/0027726 A1* | 1/2014 | Choi | H01L 51/5203 257/40 |
| 2016/0043154 A1* | 2/2016 | Choi | H01L 27/3258 257/40 |
| 2016/0293803 A1* | 6/2016 | Kim | H01L 33/465 |
| 2016/0240746 A1* | 8/2016 | Yun | H01L 33/56 |

* cited by examiner

ELECTROLUMINESCENT DEVICES WITH IMPROVED OPTICAL OUT-COUPLING EFFICIENCIES

CROSS-REFERENCE TO RELATED APPLICATION

This application is a divisional application of U.S. patent application Ser. No. 15/066,515 filed Mar. 10, 2016; which application claims priority to and the benefit of U.S. Provisional Patent Application Ser. No. 62/177,273, filed on Mar. 11, 2015, and entitled "Organic Light-Emitting Device Structures with Improved Optical Out-Coupling and Their Applications", the disclosure of which is incorporated by reference in its entirety.

FIELD OF THE INVENTION

The present invention pertains to an electroluminescent (EL) device, and more particularly pertains to an organic light-emitting device (OLED) structures with improved optical out-coupling and their applications.

BACKGROUND OF THE INVENTION

Due to various merits of organic light-emitting devices (OLEDs), such as high efficiency, wide viewing angles, fast response, potentially low cost etc., OLED technologies have become an important next-generation display technology since Dr. Tang and VanSlyke reported the first efficient and practical OLED in 1987. Due to increasing efficiencies, the OLED is also becoming practical for lighting applications. No matter display or lighting applications, external quantum efficiencies (EQEs) of OLEDs are essential. EQEs of OLEDs are determined by internal quantum efficiencies (IQEs) and the optical out-coupling efficiencies. Through appropriate combinations of materials for electrodes, carrier-transport layers (e.g., hole-transport layers-HTL, electron-transport layers-ETL), emission layers (EML), and their stacking, internal quantum efficiencies can reach nearly 100%. However, in typical OLED structures, optical out-coupling efficiencies of OLEDs are still limited.

Currently typical OLEDs are fabricated on a substrate. According to the direction of the light emission relative to the substrate, OLEDs can be classified into bottom-emitting OLEDs or top-emitting OLEDs. Bottom-emitting OLEDs 1 emit through the transparent or semi-transparent substrate 10 as FIG. 1, while top-emitting OLEDs 2 emit opposite the substrate direction as FIG. 2.

Please refer to FIG. 1, the bottom-emitting OLEDs 1 are typically composed of a single or multiple organic material layers 12 stacking and sandwiched between top reflective electrode 13 and bottom (semi-)transparent electrode 11. Through appropriate combinations of materials for electrodes, carrier-transport layers (e.g., hole-transport layers-HTL, electron-transport layers-ETL), emission layers (EML), and their stacking, internal quantum efficiencies can reach nearly 100%. However, in typical bottom-emitting OLED 1 structures, for example, glass or plastic substrate/transparent electrode such as ITO/organic layers/reflective electrode such as Al, due to higher refractive indices n of the organic layers (typically $n \geq 1.7$) and transparent electrodes (typically $n \geq 1.8$) than those of substrates (e.g., n~1.4-1.5 for glass substrates), a significant portion of internally generated light with larger angles will be confined in the device by total internal reflection at the electrode-substrate interface and cannot enter the substrate for out-coupling into air. For the light entering the substrate 10, due to higher refractive indices of transparent substrates (e.g., n~1.4-1.5 for glass substrates) than that of air, again a significant portion of light with larger angles will be confined in the substrate by total internal reflection at the substrate-air interface and cannot be out-coupled into air. As such, in typical bottom-emitting OLED structures, optical out-coupling efficiencies are generally limited to only 20-25%.

On the other hand, the typical top-emitting OLEDs 2 have the structure of substrate 20 such as glass or plastic/bottom reflective electrode such as metal 21/organic layer(s) 22/top (semi-)transparent electrode 23 such as ITO, thin metal, as shown in FIG. 2. In some cases, the top (semi-)transparent electrode may be further over-coated with transparent passivation or capping layer. Due to higher refractive indices of organic layers (typically $n \geq 1.7$), transparent electrodes (typically $n \geq 1.8$), and even transparent passivation or capping layers than that of air, a significant portion of internally generated light with larger angles will be confined in the device by total internal reflection at the device-air interface and cannot be out-coupled to air as shown in FIG. 2. Therefore, in typical top-emitting OLED structures, optical out-coupling efficiencies are generally also limited.

Therefore, to achieve high-efficiency, power-saving OLED displays or lighting, the optical out-coupling efficiencies have to be effectively raised by out-coupling otherwise trapped OLED internal light. This invention thus aims to provide OLED device structures that can effectively enhance optical out-coupling efficiencies of OLEDs.

SUMMARY OF THE PRESENT INVENTION

In order to overcome the drawbacks of prior arts, the present invention provides various embodiments described below.

In certain embodiments, an electroluminescent (EL) device is disclosed, comprising a substrate, an optically reflective concave structure and one or more functional layers. The optically reflective concave structure includes a first surface, a second surface that lies at an angle relative to the first surface, and a third surface parallel to the first surface, wherein at least the first and second surfaces of the optically reflective concave structure are optically reflective. The one or more functional layers include a light emitting layer, disposed over the surfaces of the optically reflective concave structure, wherein at least one electroluminescent area of the light emitting layer is defined on the first surface of the optically reflective concave structure. The one or more functional layers further include a patterned interlayer formed between the optically reflective concave structure and the other functional layers, and the at least one electroluminescent area is defined by the patterned interlayer. Especially, a first ratio between the maximum width of the first surface of the optically reflective concave structure and the thickness of the one or more functional layers in the optically reflective concave structure is smaller than a first constant value, which is 200, 180, 150, 100, 80 or 50. In an preferred embodiments, the electroluminescent device with the optical out-coupling efficiencies is disclosed when the first ratio is smaller than 50.

In certain embodiments, the electroluminescent device further comprises a bend of the one or more functional layers formed at the angle between the first surface and the second surface, wherein the light emitted from the electroluminescent area is re-directed and out-coupled to air by the bend, when propagating in the one or more functional layers.

In certain embodiments, the electroluminescent device further comprises a first portion of the one or more functional layers, disposed over the first surface; and a second portion of the one or more functional layers, disposed over the second surface, wherein the light emitted from the electroluminescent area is re-directed and out-coupled to air by the variation of the thicknesses between the first portion and the second portion of the one or more functional layers, when propagating from the first portion to the second portion in the one or more functional layers.

In certain embodiments, the optically reflective concave structure is directly formed by an optically reflective material, selected from the group consisting of metal and scattering reflector. In certain embodiments, the optically reflective concave structure is composed of a concave structure and an optically reflective surface, and the material of the optically reflective surface is selected from the group consisting of metal, transparent conductive metal-oxide, transparent dielectric, scattering reflector, distributed Bragg reflector formed by alternate stacking of high-index/low-index materials, and their stacking or combinations. The material of the first surface is the same as, or different from that of the second surface of the concave structure.

In certain embodiments, the electroluminescent area of the light emitting layer is extended to the intersection of the second and third surfaces of the optically reflective concave structure.

In certain embodiments, the optically reflective surfaces of the optically reflective concave structure have a relatively high optical reflectance more than 80% in the wavelength range of the light emitted from the electroluminescent area.

In certain embodiments, the functional layers in the optically reflective concave structure have a relatively high transparency more than 75% in the wavelength range of the light emitted from the electroluminescent area.

In certain embodiments, another electroluminescent (EL) device is disclosed. Said electroluminescent (EL) device further comprising an index-matching material that is mostly filled on the first and second surfaces of the optically reflective concave structure and over the one or more functional layers. The light emitted from the electroluminescent area is re-directed and out-coupled to air, and the number of reflection of the reflected or total internal reflected light and corresponding optical loss is reduced before being re-directed and out-coupled, when propagating in the one or more functional layers and the index-matching material. Especially, a second ratio between the maximum width of the first surface of the optically reflective concave structure and the total thickness of the one or more functional layers and the index-matching material in the optically reflective concave structure is smaller than a second constant value, which is 60 or 30. In an preferred embodiments, the electroluminescent device with the optical out-coupling efficiencies is disclosed when the second ratio is smaller than 30.

In certain embodiments, the refractive indices of the other functional layers and the index-matching material within the optically reflective concave structure are kept within ±0.2 of that of the light emitting layer or higher than that of the light emitting layer, and the other functional layers and the index-matching material within the optically reflective concave structure have relatively high transparency of more than 75% in the wavelength range of the light emitted from the electroluminescent area.

In certain embodiments, the exposed surface of the index-matching material within the optically reflective concave structure is flat or curved.

In certain embodiments, a display including said electroluminescent (EL) device is disclosed. The display comprises a substrate, a thin-film transistor (TFT) formed on the substrate, and an interconnection conductor being electrical contact to the thin-film transistor, wherein said electroluminescent device electrically contacts to the interconnection conductor via the first surface of the optically reflective concave structure.

In certain embodiments, the interconnection conductor also serves as the first surface of the optically reflective concave structure in said electroluminescent device.

In certain embodiments, the surfaces of the optically reflective concave structure in said electroluminescent device is non-conductive, and the one or more functional layers include a first electrode disposed between the other functional layers and the optically reflective concave structure, wherein the first electrode is electrically connected to the interconnection conductor and the one or more functional layers.

In certain embodiments, a display including said electroluminescent (EL) device is disclosed. The display comprises a substrate, a thin-film transistor (TFT) formed on the substrate, and an interconnection conductor being electrical contact to the thin-film transistor, wherein said electroluminescent device electrically contacts to the interconnection conductor via the third surface of the optically reflective concave structure.

In certain embodiments, the interconnection conductor also serves as the surfaces of the optically reflective concave structure.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

FIG. 14. One possible fabrication/processing flow for fabrication of FIG. 13a.

FIGS. 27a and 27b. Possible embodiments of top-emitting OLEDs having the concave and optically reflective structure based on FIG. 26a.

DETAILED DESCRIPTION OF THE INVENTION

It is to be understood that both the foregoing general description and the following detailed description are exemplary and explanatory only and are not restrictive of the invention, as claimed. It should be noted that, as used in the specification and the appended claims, the singular forms "a", "an" and "the" include plural referents unless the context clearly dictates otherwise. Thus, for example, reference to "a material" may include mixtures of materials; reference to "a display" may include multiple displays, and the like. References cited herein are hereby incorporated by reference in their entirety, except to the extent that they conflict with teachings explicitly set forth in this specification.

Please refer to FIG. 3 to FIG. 7, the invention provides an OLED structure with high optical out-coupling efficiency, whose principles, structure and characteristics are described as following (1)-(6).

(1) First, the OLED structure contains an optically reflective concave structure 200 formed on a substrate 100. The optically reflective concave structure 200 includes a first surface (a bottom surface), a second surface (an inclined surface) that lies at an angle relative to the first surface, and a third surface (a top surface) parallel to the first surface, and at least the first and second surfaces of the optically reflective concave structure 200 are optically reflective.

Figure 1:
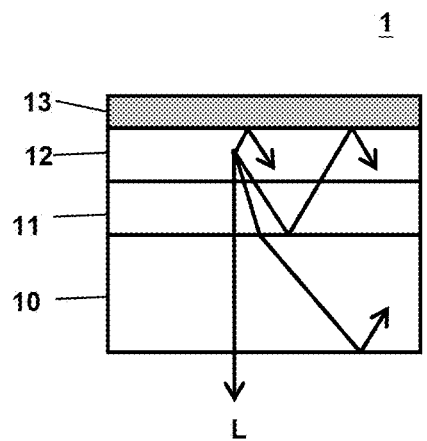
FIG. 1. Schematic structure of typical bottom-emitting OLED.
Figure 2:
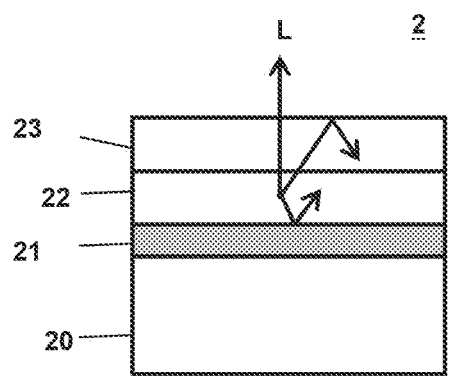
FIG. 2. Schematic structure of typical top-emitting OLED.
Figure 3:
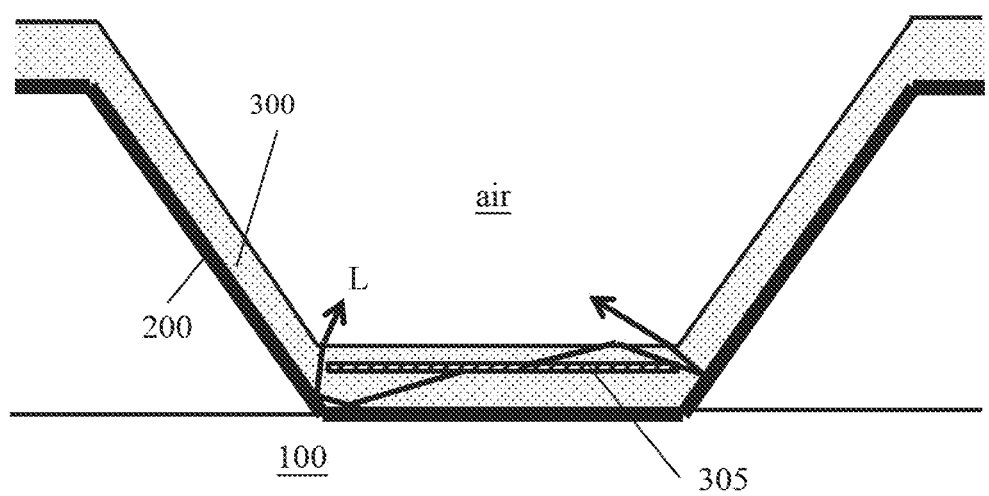
FIG. 3. The top-emitting OLED structure contains a single emission zone inside the concave and optically reflective structure formed on a substrate.
Figure 4:
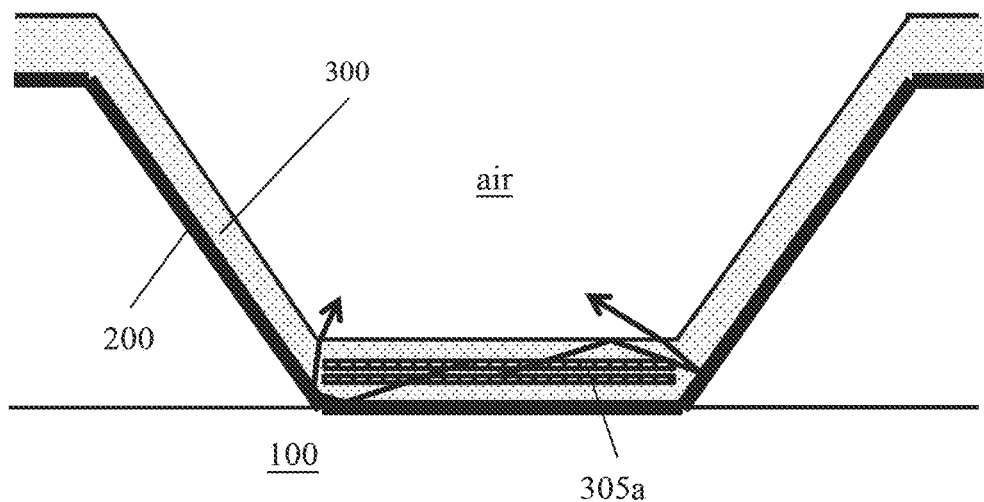
FIG. 4. The top-emitting OLED structure contains multiple emission zones inside the concave and optically reflective structure formed on a substrate.
Figure 5:
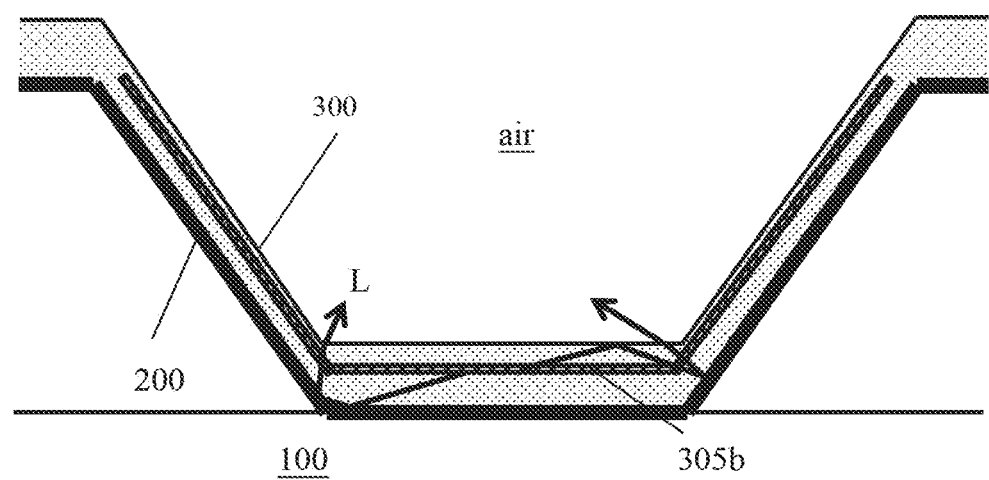
FIG. 5. The top-emitting OLED structure contains a single emission zone extending to the side slopes and the top edge of the concave and optically reflective structure formed on a substrate.
Figure 6:
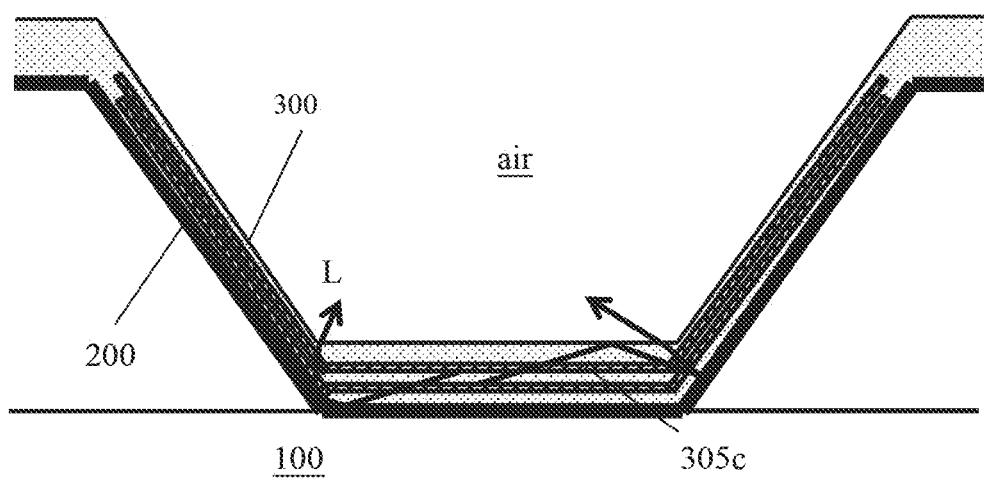
FIG. 6. The top-emitting OLED structure contains multiple emission zones extending to the side slopes and the top edge of the concave and optically reflective structure formed on a substrate.

(2) Second, various functional layers 300 of the OLED, such as at least one light emitting layer (or called emission layer), charge transport layer(s), electrode layer(s), insulating dielectric layer(s) to define the electroluminescent area 305/305a/305b/305c (or called emission zones) of the OLED, and passivation/capping layer(s) etc. that typically have refractive indices higher than that of air, are disposed over the surfaces of the optically reflective concave structure 200, forming one or multiple OLED electroluminescent areas 305/305a on the bottom of the concave structure, as shown in FIG. 3 and FIG. 4, or forming one or multiple OLED electroluminescent areas 305b/305c that extend to the top edge of the concave structure 200, as shown in FIG. 5 and FIG. 6.

Figure 7A:
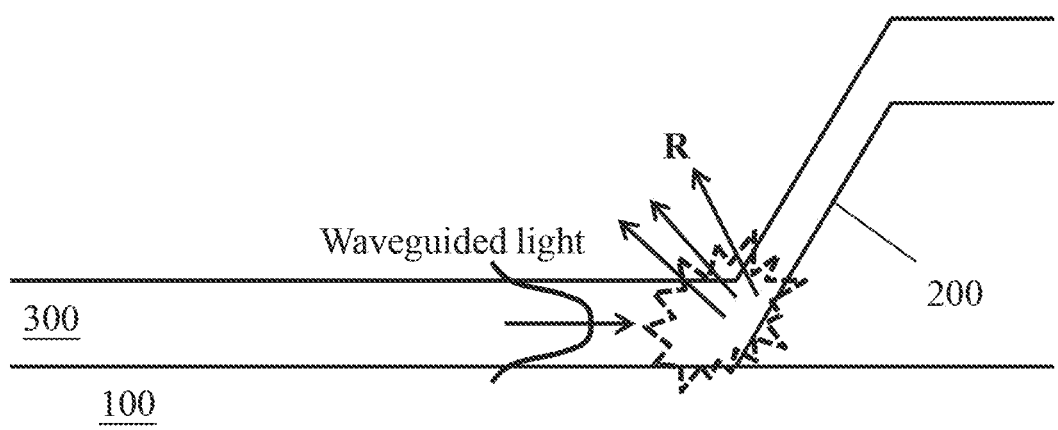
FIG. 7a. The optical energy originally trapped by total internal reflection or reflection at the OLED functional material layer(s)/air interface may be re-directed and be out-coupled to air by the bending of the concave structure, when propagating in the layers.
Figure 7B:
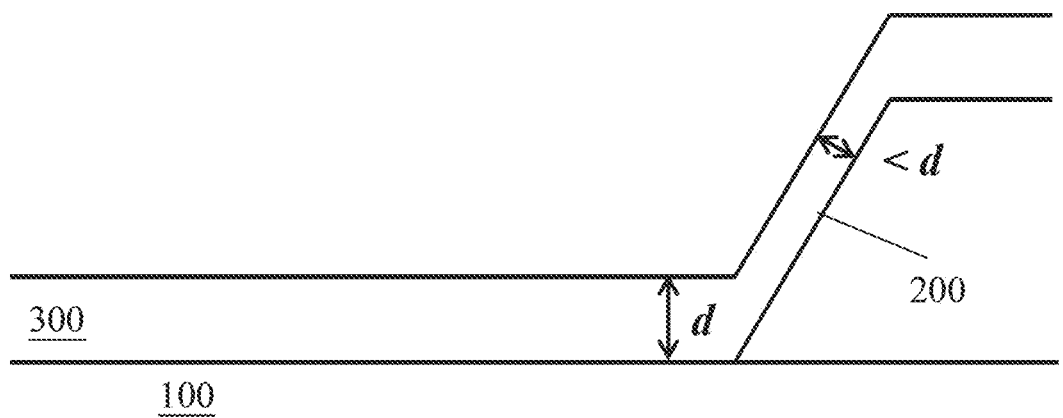
FIG. 7b. The optical energy originally trapped by total internal reflection or reflection at the OLED functional material layer(s)/air interface may be re-directed and be out-coupled to air by the change/variation of the layer thicknesses, when propagating in the layers.
Figure 8A:
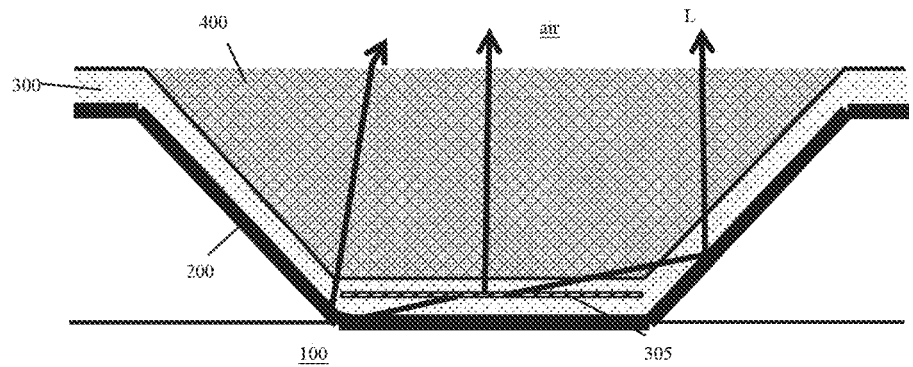
FIGS. 8a and 8b. The top-emitting OLED structure having a single emission zone inside the concave (at the bottom) and optically reflective structure formed on a substrate and further having an index-matching filling material disposed inside the concave area. The top surface of the index-matching filling material/layer is flat or curved/non-planar.
Figure 8B:
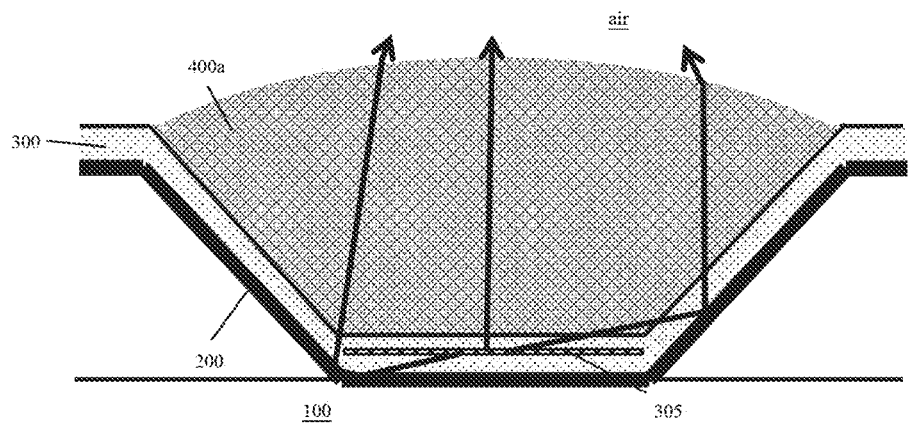
Figure 9A:
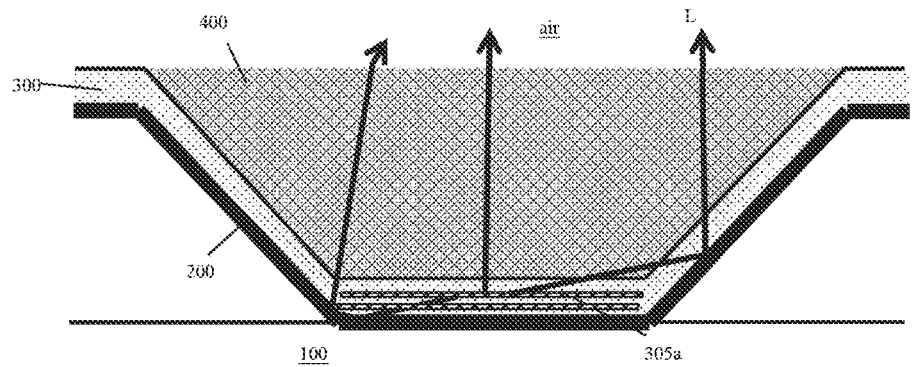
FIGS. 9a and 9b. The top-emitting OLED structure having multiple emission zones inside the concave (at the bottom) and optically reflective structure formed on a substrate and further having an index-matching filling material disposed inside the concave area. The top surface of the index-matching filling material/layer is flat or curved/non-planar.
Figure 9B:
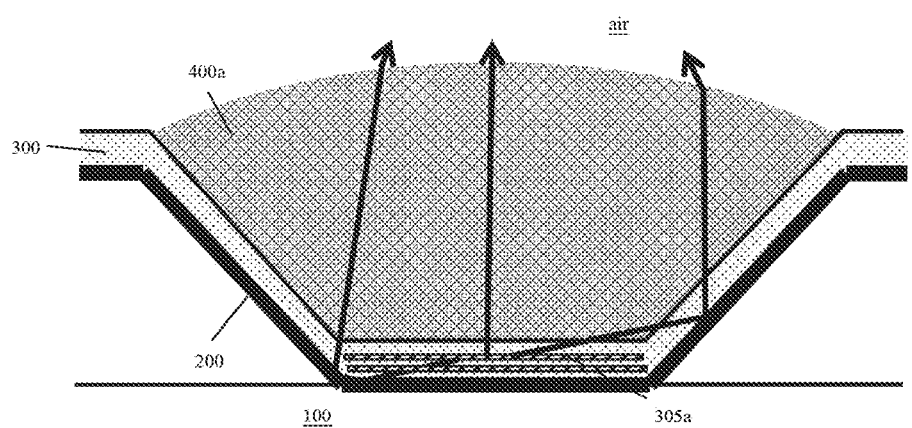
Figure 10A:
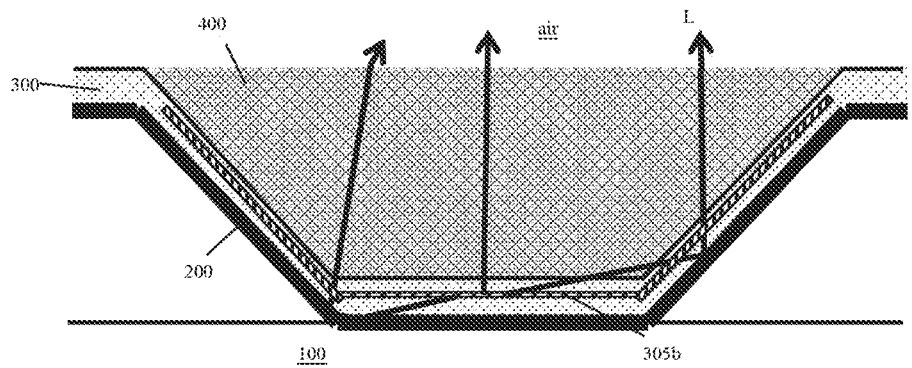
FIGS. 10a and 10b. The top-emitting OLED structure having a single emission zone a single emission zone extending to the side slopes and the top edge of the concave and optically reflective structure formed on a substrate and further having an index-matching filling material disposed inside the concave area. The top surface of the index-matching filling material/layer is flat or curved/non-planar.
Figure 10B:
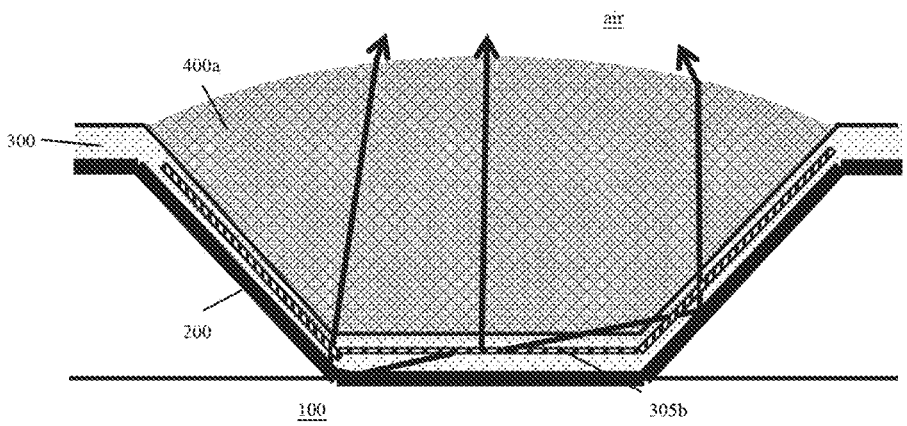
Figure 11A:
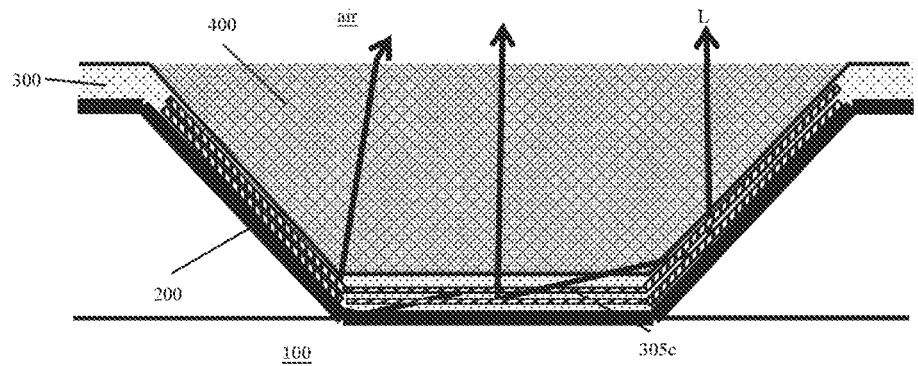
FIGS. 11a and 11b. The top-emitting OLED structure having a single emission zone a single emission zone extending to the side slopes and the top edge of the concave and optically reflective structure formed on a substrate and further having an index-matching filling material disposed inside the concave area. The top surface of the index-matching filling material/layer is flat or curved/non-planar.
Figure 11B:
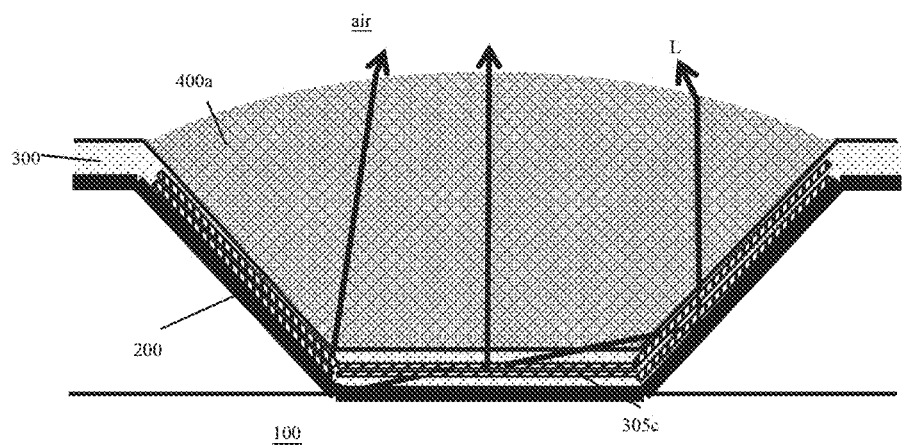

(3) With such an OLED structure, the optical energy originally trapped by total internal reflection or reflection at the OLED functional material layer(s)/air interface may be re-directed and be out-coupled to air by the bending of the concave structure, as shown in FIG. 7a, or the change/variation of the layer thicknesses, as shown in FIG. 7b, when light L is propagating in the layers 300. Wherein the bend of the one or more functional layers formed at the angle between the first surface and the second surface. The thickness of a first portion of the one or more functional layers 300 disposed over the first surface is d, and the thickness of a second portion of the one or more functional layers 300 disposed over the second surface is <d.

(4) To reduce the optical loss of reflected or total internal reflected light during reflection/propagation in the structure, the concave structure should have a relatively high optical reflectance (e.g., >80%) in the wavelength range of the light emitted from the electroluminescent area (or called emission wavelength range).

(5) To reduce the optical loss of reflected or total internal reflected light during reflection/propagation in the structure, various functional layers in the concave structure should have a relatively high transparency (e.g., >75%) in the emission wavelength range.

(6) To reduce the optical loss of reflected or total internal reflected light during reflection/propagation in the structure, the ratio between the maximum width of the concave area and the total thickness of functional layers in the concave and optical reflective structure should be kept small enough to reduce the number of reflection and total internal reflection within the structure. For example, the ratio of maximum width overall the total layer thickness is <200, 180, 150, 100, 80 or 50. In an preferred embodiments, the electroluminescent device with the optical out-coupling efficiencies is disclosed when the ratio is <50.

Please refer to FIG. 8 to FIG. 11, this invention provides another OLED structure with high optical out-coupling efficiency, whose principles, structure and characteristics are described as following (1)-(10).

(1) First, the OLED structure contains an optically reflective concave structure 200 formed on a substrate 100. The optically reflective concave structure 200 includes a first surface, a second surface that lies at an angle relative to the first surface, and a third surface parallel to the first surface, and at least the first and second surfaces of the optically reflective concave structure 200 are optically reflective.

(2) Second, various functional layers 300 of the OLED, such as emission layer(s), charge transport layer(s), electrode layer(s), insulating dielectric layer(s) to define the emission area 305/305a/305b/305c of the OLED, and passivation/capping layer(s) etc. that typically have refractive indices higher than that of air, are disposed over surface of the concave and optically reflective structure 200 (or called optically reflective concave structure), forming one or multiple OLED emission zones 305/305a on the bottom surface of the concave structure as shown in FIGS. 8a, 8b, 9a and 9b, or forming one or multiple OLED emission zones 305b/305c that extend to the top edge of the concave area as shown in FIGS. 10a, 10b, 11a and 11b.

(3) Further, the relatively transparent material 400/400a (referred as the index-matching material) having a refractive index similar to those of the OLED emission layer(s)/emission zone is disposed over the OLED functional layers 300 within the concave structure 200 to fill or nearly fill the concave and optically reflective structure 200. The exposed surface of the index-matching filling material/layer 400/400a can be flat or curved, as shown in FIG. 8-11. Filling the index-matching material 400/400a can increase the overall thickness of functional layers 300 within the concave and optically reflective area 200 and reduce the number of reflection (and corresponding optical loss) of the reflected or total internal reflected light before being re-directed by the concave and optically reflective structure for optical out-coupling.

(4) Also, the refractive indices of various functional layer(s) 300/400 within the concave and optically reflective area 200 are kept similar or homogeneous (e.g., with refractive indices n being within ±0.2 of that of the emission layer/zone) or higher than those of the emission layer(s)/zone, so that the difference in refractive indices and layer structures are not sufficient to induce total internal reflection (or waveguided modes) between layers.

(5) With such an OLED structure, the optical energy L originally trapped by total internal reflection or reflection of the material/air interface may be re-directed and be out-coupled to air by reflection or multiple reflection of the concave and optically reflective structure 200.

(6) In such an OLED structure, to effectively re-direct and out-couple the optical energy originally trapped by total internal reflection or reflection of the material/air interface, the profile of the concave structure 200 shall not be too steep (e.g., nearly vertical or 90°) or be too gentle (e.g., nearly flat or 0°).

(7) To reduce the optical loss of reflected or total internal reflected light during reflection/propagation in the structure, the concave and optical reflective structure should have a relatively high optical reflectance (e.g., >80%) in the emission wavelength range.

(8) To reduce the optical loss of reflected or total internal reflected light during reflection/propagation in the structure, various functional layers in the concave and optical reflective structure should have a relatively high transparency (e.g., >75%) in the emission wavelength range.

(9) To reduce the optical loss of reflected or total internal reflected light during reflection/propagation in the structure, the ratio between the maximum width and the depth of the concave and optically reflective structure 200 should be kept small enough to reduce the number of reflection and total internal reflection within the structure. For example, the ratio of maximum width overall the depth is <60 or 30. In an preferred embodiments, the electroluminescent device with the optical out-coupling efficiencies is disclosed when the ratio is <30. Further, the ratio between the maximum width of the concave area 200 and the total thickness of functional layers 300/400 in the concave and optical reflective structure 200 should be kept small enough to reduce the number of reflection and total internal reflection within the structure. For example, the ratio of maximum width overall the total layer thickness is <60 or 30. In an preferred embodiments, the electroluminescent device with the optical out-coupling efficiencies is disclosed when the ratio is <30.

(10) If a portion of some functional layers disposed over the concave and optically reflective structure 200 extends to the non-concave area (FIG. 8-11), the overall total layer thickness of such extended part shall be kept much smaller than the depth of the concave and reflective structure 200 and the overall total layer thickness disposed within the concave area, to reduce the leakage of light energy propagating and bouncing within the concave area to the extended area and to reduce the ratio of light that cannot be out-coupled by the concave and optically reflective structure 200.

This invention provides a top-emitting active matrix OLED display (top-emitting AMOLED) structure that makes use of the above mentioned OLED structures with high optical out-coupling efficiency and thus would have enhanced emission efficiency and reduced power consumption. The array of the above mentioned OLED structures with high optical out-coupling efficiency are formed over the substrate having the thin-film transistor (TFT) driving circuit array. An appropriate electrical interconnection is formed between the TFT driving circuit array and the OLED array above, so that the TFT driving circuit array can drive and control the OLED array, achieving the top-emitting AMOLED.

There have been some reported approaches for enhancing light out-coupling of OLEDs, such as micro-lens, surface textures, scattering, embedded low-index grids, embedded grating/corrugation, embedded photonic crystals, high-index substrates etc. Although these different methods/structures can provide enhancement of OLED light out-coupling to some degree and may be useful for OLED lighting and/or bottom-emitting OLED structures, they may not be readily applicable to OLED displays for enhancing light out-coupling of OLED pixels, due to a few factors and difficulties: (1) the optical out-coupling structures/processing may not be compatible with OLED displays, or the optical out-coupling structures/processing may be too complicated, too small (e.g., need to use very high-resolution nano-fabrication or nano-processing), too expensive, or too difficult to integrate with OLED display structures and processing; (2) the out-coupling structures/effects may lead to light leakage/diffusion to neighboring pixels and thus lead to pixel blurring that would degrade the display resolution and image quality, making them not useful for OLED displays; (3) the out-coupling structures/effects may lead to optical scattering, diffusive reflection, diffractive reflection of ambient incident light and thus lead to degradation of display contrast and image quality, making them not useful for OLED displays. As such, current (top-emitting) OLED displays hardly adopt effective light out-coupling techniques/structures for boosting efficiencies and power saving, although it is highly desired for mobile applications.

The inventions disclosed here, as compared to various prior arts for enhancing light out-coupling of OLEDs in general could have the following features/merits for OLED display applications:

(1) It could extract otherwise trapped light (e.g., waveguided modes or the large-angle total internally reflected light), giving high optical out-coupling efficiency.

(2) The extraction mechanism here is rather wavelength insensitive, therefore good for all R/G/B/W-color OLEDs and good for both display and lighting applications.

(3) The extraction structure and mechanism here could re-mix/re-distribute internal emission of different angles, and therefore reduce angular dependence (e.g., viewing angle dependent emission characteristics induced by microcavity effect) of pixel OLED emission and be beneficial to viewing-angle characteristics/performance and color performance of OLED displays.

(4) The structure here could confine pixel emission mainly within the concave and reflective structure of the pixel element of an OLED display, thus reduce leakage of emission of a pixel element to and re-radiation at neighboring pixels, and would not have pixel blurring/mixing problems (that would degrade display resolution) as in other OLED out-coupling structures and techniques.

(5) When used in the pixel element of OLED displays, the structure here has no major change in optical effects of incident ambient light as compared to conventional OLED pixel structures, and therefore it shall not induce optical scattering, diffusive reflection, diffractive reflection of ambient incident light and thus could keep high contrast of the pixel image.

(6) When using structures having non-planar emission zones in the OLED display pixel element, they could also increase the emission area/filling factor/aperture ratio of the OLED pixel, which is beneficial for OLED displays requiring higher and higher pixel densities and display resolutions.

(7) It only slightly modifies current top-emitting AMOLED structure and processing (e.g., 1-2 more photo-masks during the fabrication), requires no nano-scale (very high-resolution) fabrication, and has good compatibility and feasibility with current AMOLED structures and processing.

Figure 12A:
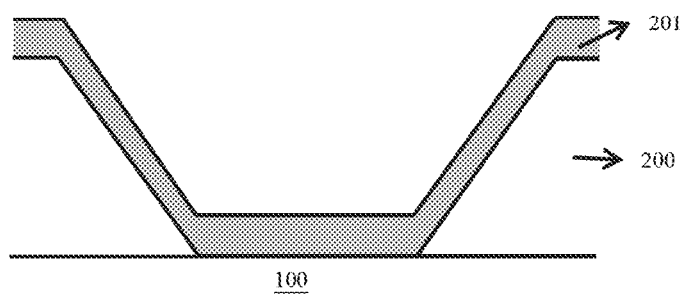
FIGS. 12a, 12b and 12c. Several possible types of the concave and optically reflective structures of this invention.
Figure 12B:
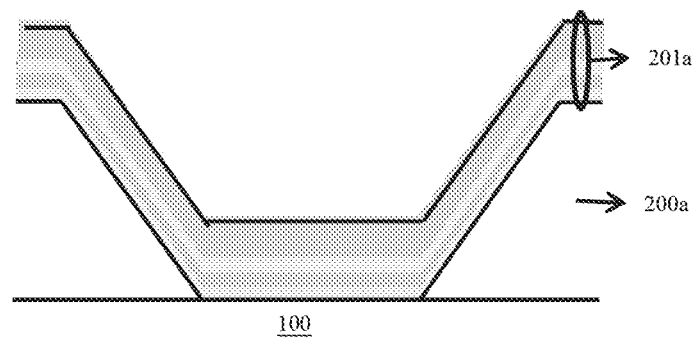
Figure 12C:
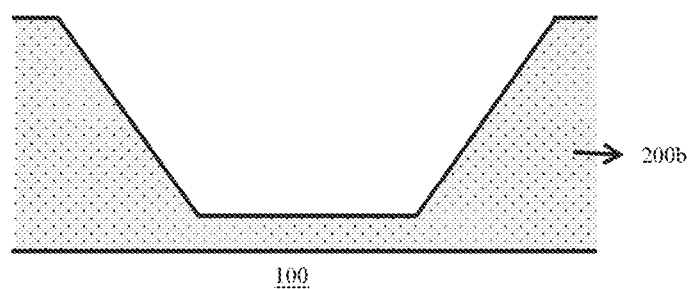

Embodiment of the Optically Reflective Concave Structure: Material of the First Surface (the Bottom Surface) is the Same as that of the Second Surface (the Inclined Surface) of the Optically Reflective Concave Structure FIGS. 12a, 12b and 12c illustrate several possible types of the optically reflective concave structure of this invention. The optically reflective concave structure may be directly formed by an optically reflective material, selected from the group consisting of metal and scattering reflector. The optically reflective concave structure may also be composed of a concave structure and an optically reflective surface. The material of the optically reflective surface is selected from the group consisting of metal, transparent conductive metal-oxide, transparent dielectric, scattering reflector, distributed Bragg reflector formed by alternate stacking of high-index/low-index materials, and their stacking or combinations.

The first type, which is shown in FIG. 12a, which is formed by disposing (and patterning) highly optically reflective and conductive layer(s) 201, such as Al, Ag, Al:Ag alloys, or their stacks, over the concave structure layer 200, or further disposing conductive indium tin oxide (ITO), indium zinc oxide (IZO), aluminum zinc oxide (AZO), gallium zinc oxide (GZO) over the Al (Ag, Al:Ag alloys, Ag/Al stacks). Such highly optically reflective and conductive layer(s) 201 can serve as the bottom electrode of the OLED.

The second type, which is shown in FIG. 12b, which is formed by disposing (and patterning) appropriate combinations of transparent dielectric layers 201a having high reflection, such as the distributed Bragg reflector (DBR) formed by alternate stacking of high-index/low-index materials (e.g., ITO/SiO$_2$, TiO$_2$/SiO$_2$, Ta$_2$O$_5$/SiO$_2$ etc.), over the concave structure layer 200a.

The third type, which is shown in FIG. 12c, which is formed by using a material having strong optical scattering reflection to directly form the concave structure layer 200b. Both the bottom and the inclined sides of the concave structure are the scattering reflective material.

Below, using the concave and optically reflective structure of FIG. 12a, two embodiment examples of top-emitting OLEDs and four embodiment examples top-emitting AMO-LEDs having the concave and optically reflective structures are described. With slight modification of the processing and processing flows of these embodiment examples, top-emitting OLEDs and top-emitting AMOLEDs having the concave and optically reflective structures of FIG. 12b and FIG. 12c can also be readily implemented.

Figure 13A:
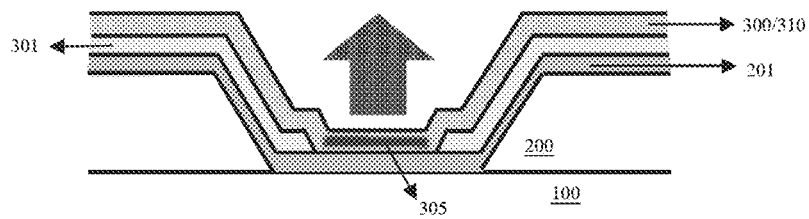
FIGS. 13a, 13b and 13c. Several possible embodiments of top-emitting OLEDs having the concave and optically reflective structure.
Figure 13B:
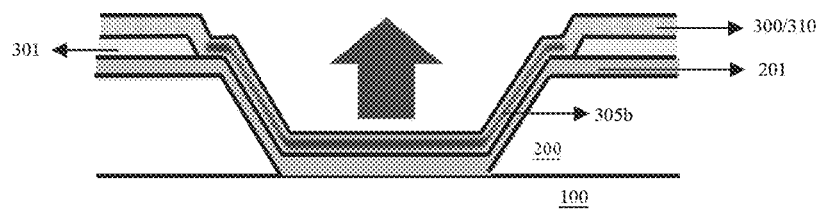
Figure 13C:
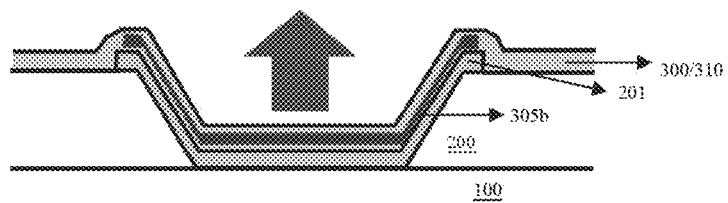

Embodiment 1: Structure and Fabrication Method for the Electroluminescent Device Having the Optically Reflective Concave Structure FIGS. 13a, 13b and 13c illustrate several possible embodiments of OLEDs having the concave and optically reflective structure 200, including the structure with the OLED emission zone 305 within the concave area (at the bottom), as shown in FIG. 13a, and the structure with the OLED emission zone 305b extending to the side slopes and the top edge of the concave area, as shown in FIGS. 13b and 13c. In all these OLED structures, the concave and optically reflective structures 200 are first formed on a substrate 100. Then, various functional layers 300 of the OLED, such as emission layer(s), charge transport layer(s), electrode layer(s), insulating dielectric layer(s) 301 to define the emission area of the OLED, and passivation/capping layer(s) 310 etc. that typically have refractive indices higher than that of air, are disposed over surface of the concave and optically reflective structure 200, forming OLED emission zones inside the concave area, as shown in FIG. 13a, or forming OLED emission zones that extend to the top edge of the concave area, as shown in FIGS. 13b and 13c. In disposing OLED functional layers 300, if more than one emitting layers/units are disposed in the layer structure, then multiple emission zones 305 may be formed and stacked in the concave and optically reflective structure 200.

Figure 14:
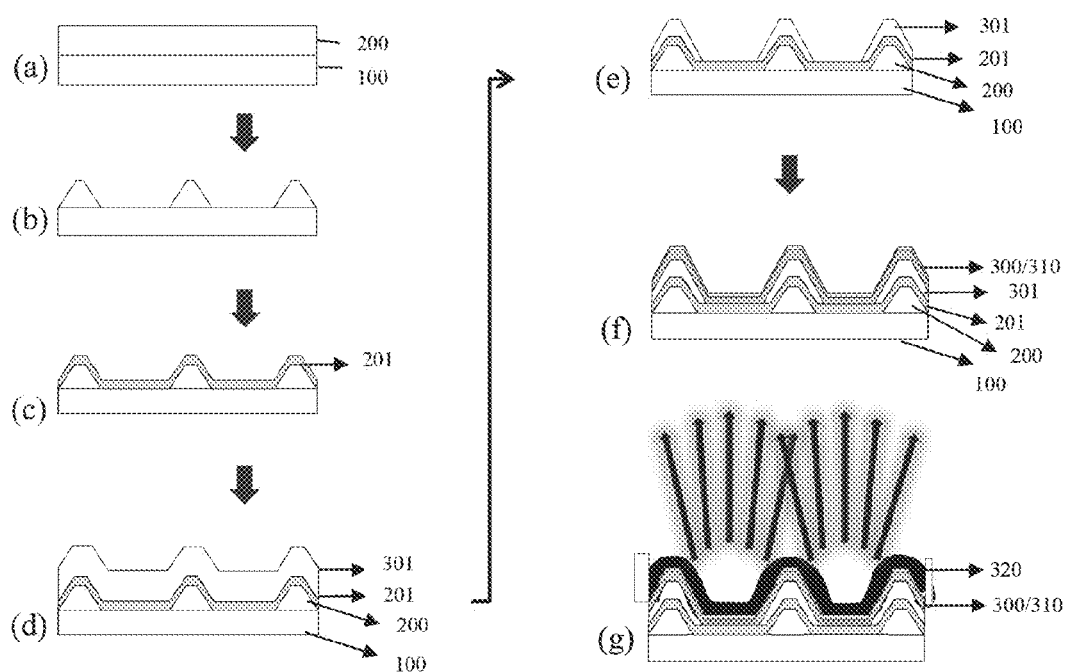

Below, using the structure of FIG. 13a as the example, one possible fabrication/processing flow for its fabrication is illustrated in FIG. 14. Meanwhile, the structures of FIGS. 13b and 13c can be similarly fabricated by slightly modifying the processing/fabrication flow shown in FIG. 14.

(a) Dispose a material layer 200 on a substrate 100 for the formation of the concave structure.

(b) With using the photo-mask and photolithography, form the concave structure (a single concave structure or an array of concave structures) in this material layer through etching of the material layer or through photo-patterning/developing of a photopolymer.

(c) Dispose (and pattern) highly optically reflective layer(s) 201, such as Al, Ag, Al:Ag alloys, or their stacks, over the concave structure layer 200, or further disposing conductive indium tin oxide (ITO), indium zinc oxide (IZO), aluminum zinc oxide (AZO), gallium zinc oxide (GZO) over the Al (Ag, Al:Ag alloys, Ag/Al stacks). Such highly optically reflective and conductive layer(s) can serve as the bottom electrode of the OLED.

(d) Dispose and pattern the insulating dielectric layer(s) 301 (e.g., SiO2, SiNx etc. deposited by PECVD or sputtering) to define the emission area of the OLED.

(e) Dispose various functional layers 300 of the OLED, such as carrier injection layer(s), emission layer(s), charge transport layer(s) etc. These OLED functional layers 300 can be disposed over the whole area or selectively only over the concave area (e.g., selective deposition through vacuum deposition through a shadow mask or through ink-jet printing).

(f) Dispose the semi-transparent or transparent top electrode 310 of the OLED structure. The semi-transparent or transparent top electrode 310 could be ITO, IZO, AZO, GZO, thin metal layer (e.g., <=25 nm thickness) of Al, Ag, Al:Ag alloy, Mg:Ag alloy, Al/Ag stacks, Mg/Ag stacks etc.

(g) If necessary, other functional layers, such as the passivation/capping layer 320, can be further disposed over the top semi-transparent or transparent electrode 310 of the OLED.

The concave structure layer 200 can be formed by: (1) the etching method, or (2) the photo-patterning/developing of a photopolymer.

Figure 15:
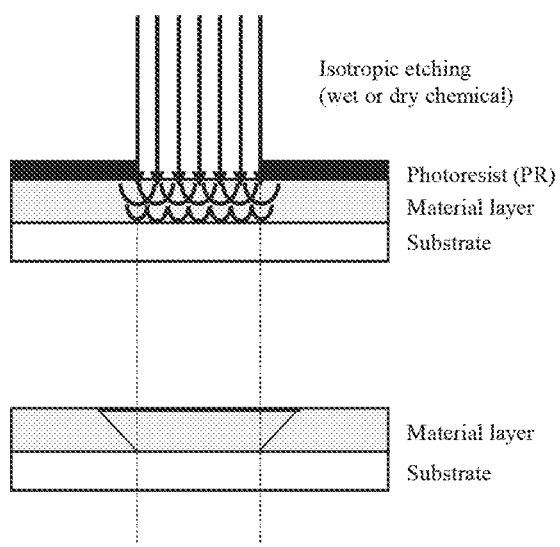
FIG. 15. Using the etching method to form concave areas in the concave structure layer.

For the etching method, as shown in FIG. 15, the processing steps might include:

(1) Dispose a material layer on a substrate for the formation of the concave structure, such as SiO$_2$, SiN$_x$ dielectric material layer(s) deposited by PECVD or sputtering.

(2) For a photoresist pattern over such a material layer 200 through coating/exposure/developing of a photoresist layer.

(3) Use the isotropic etching recipe to etch the concave structure material layer 200 through the opening in the photoresist layer. Due to lateral etching characteristics of the isotropic etching, not only the material under the opening will be etched away, but also a portion of the material under the photoresist layer and near the edge of the photoresist opening will be partially etched away, forming a taper structure near the edge of the photoresist opening. The isotropic etching used could be a wet etching method or a dry etching method widely reported in the literature.

(4) After removal of the photoresist, the layer with concave structures is obtained.

Figure 16:
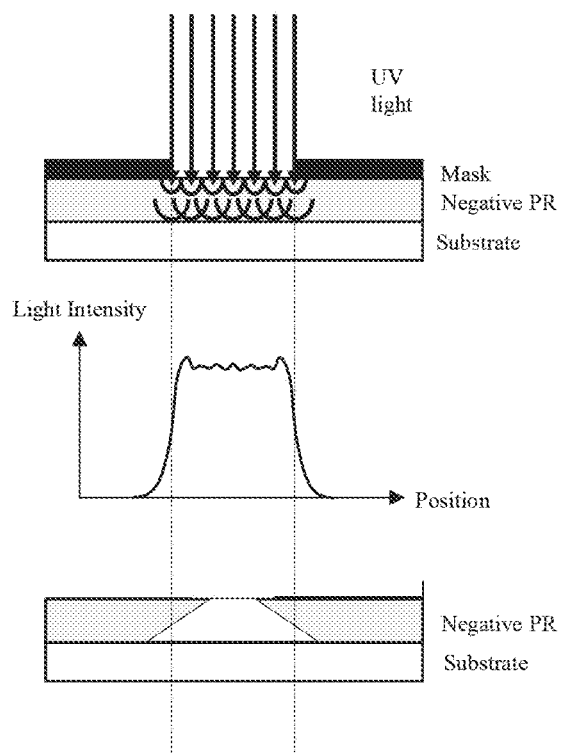
FIG. 16. Using the photo-patterning/developing of a photopolymer to form the concave areas in the concave structure layer.

For the method of photo-patterning/developing of a photopolymer, as shown in FIG. 16, the processing steps might include:

(1) Dispose a photopolymer layer on a substrate 100 for the formation of the concave structure 200, such as a negative photoresist/photopolymer.

(2) Conduct a patterned (UV) light exposure of the photopolymer through a photomask pattern. During the exposure, due to diffraction/diffusion effect near edges of photomask patterns, there would still be partial exposure/developing for areas under photomask pattern edges.

(3) After exposure, conduct development of the negative photoresist/photopolymer. Un-exposed areas/materials would be removed by the developer, while UV-light-exposed areas/materials would remain due to photo-induced cross-linking. Due to partial exposure/developing effect under photomask pattern edges, the concave structure layer with tapers is formed after development.

With such OLED structures in FIGS. 13a, 13b and 13c, the optical energy originally trapped by total internal reflection or reflection of the material/air interface may be re-directed and be out-coupled to air by the bending of the concave structure or the change/variation of the layer thicknesses, when propagating in the layers, as shown in FIGS. 7a-7b.

To reduce the optical loss of reflected or total internal reflected light during reflection/propagation in the structure, the concave and optical reflective structure should have a relatively high optical reflectance (e.g., >80%) in the emission wavelength range.

To reduce the optical loss of reflected or total internal reflected light during reflection/propagation in the structure, various functional layers in the concave and optical reflective structure should have a relatively high transparency (e.g., >75%) in the emission wavelength range.

To reduce the optical loss of reflected or total internal reflected light during reflection/propagation in the structure, the ratio between the maximum width of the concave area and the total thickness of functional layers in the concave and optical reflective structure should be kept small enough to reduce the number of reflection and total internal reflection within the structure. For example, the ratio of maximum width overall the total layer thickness is <200, 180, 150, 100, 80 or 50. In an preferred embodiments, the electroluminescent device with the optical out-coupling efficiencies is disclosed when the ratio is <50.

Figure 17A:
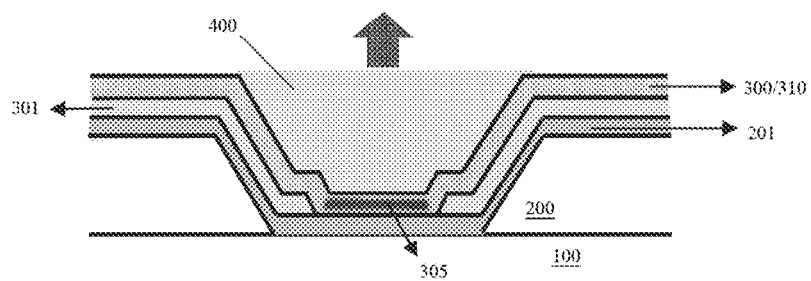
FIGS. 17a, 17b and 17c. Several other possible embodiments of top-emitting OLEDs having the concave and optically reflective structure.
Figure 17B:
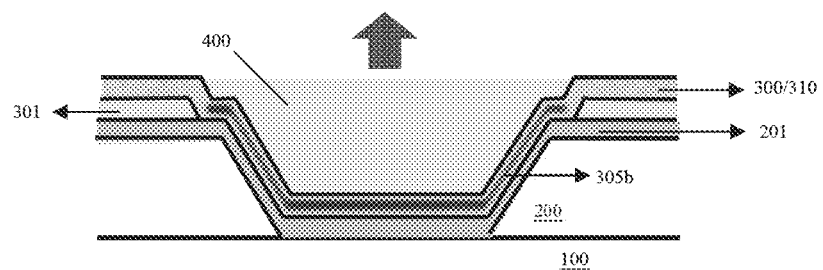
Figure 17C:
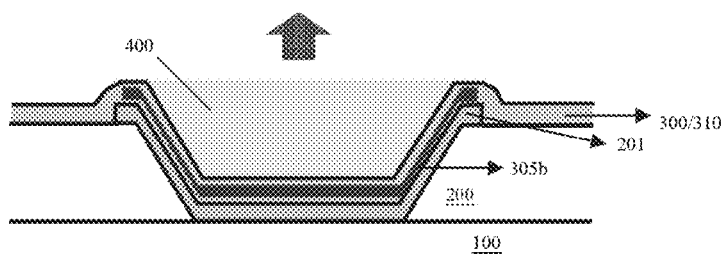

Embodiment 2: Structure and Fabrication Method for the Electroluminescent Device Having the Optically Reflective Concave Structure with the Flat or Curved Exposed Surface of the Index-Matching Material FIGS. 17a, 17b and 17c illustrate several other possible embodiments of OLEDs having the concave and optically reflective structure 200, including the structure with the OLED emission zone 305 within the concave area in FIG. 17a and the structure with the OLED emission zone 305b extending to the top edge of the concave area in FIGS. 17b and 17c. Their structures and possible fabrication are similar to those shown in FIGS. 13a, 13b and 13c and FIG. 14, and yet a relatively transparent material 400 (referred as the index-matching filling material) having a refractive index similar to those of the OLED emission layer(s)/emission zone 305/305b is further disposed over the OLED functional layers 300 within the concave area to fill or nearly fill the concave and optically reflective structure. Filling the index-matching material 400 can increase the overall thickness of functional layers within the concave and optically reflective area and reduce the number of reflection (and corresponding optical loss) of the reflected or total internal reflected light before being re-directed by the concave and optically reflective structure for optical out-coupling. In disposing OLED functional layers, if more than one emitting layers/units are disposed in the layer structure, then multiple emission zones may be formed and stacked in the concave and optically reflective structure.

Also, the refractive indices of various functional layer(s) within the concave and optically reflective area are kept similar or homogeneous (e.g., with refractive indices n being within ±0.2 of that of the emission layer/zone) or higher than those of the emission layer(s)/zone, so that the difference in refractive indices and layer structures are not sufficient to induce total internal reflection (or waveguided modes) between layers.

With these OLED structures, the optical energy originally trapped by total internal reflection or reflection of the material/air interface may be re-directed and be out-coupled to air by reflection or multiple reflection of the concave and optically reflective structure.

In these OLED structures, to effectively re-direct and out-couple the optical energy originally trapped by total internal reflection or reflection of the material/air interface, the profile (side slopes) of the concave structure shall not be too steep (e.g., nearly vertical or 90° side slope) or be too gentle (e.g., nearly flat or 0° side slope).

To reduce the optical loss of reflected or total internal reflected light during reflection/propagation in the structure, the concave and optical reflective structure should have a relatively high optical reflectance (e.g., >80%) in the emission wavelength range.

To reduce the optical loss of reflected or total internal reflected light during reflection/propagation in the structure, various functional layers in the concave and optical reflective structure should have a relatively high transparency (e.g., >75%) in the emission wavelength range.

To reduce the optical loss of reflected or total internal reflected light during reflection/propagation in the structure, the ratio between the maximum width and the depth of the concave and optically reflective structure should be kept small enough to reduce the number of reflection and total internal reflection within the structure. For example, the ratio of maximum width overall the depth is <60 or 30. In an preferred embodiments, the electroluminescent device with the optical out-coupling efficiencies is disclosed when the ratio is <30. Further, the ratio between the maximum width of the concave area and the total thickness of functional layers in the concave and optical reflective structure should be kept small enough to reduce the number of reflection and total internal reflection within the structure. For example, the ratio of maximum width overall the total layer thickness is <60 or 30. In an preferred embodiments, the electroluminescent device with the optical out-coupling efficiencies is disclosed when the ratio is <30.

If a portion of some functional layers disposed over the concave and optically reflective structure extends outside to the non-concave area, the overall total layer thickness of such extended part shall be kept much smaller than the depth of the concave and reflective structure and the overall total layer thickness disposed within the concave area, to reduce the leakage of light energy propagating and bouncing within the concave area to the extended area and to reduce the ratio of light that cannot be out-coupled by the concave and optically reflective structure.

The disposition of the index-matching filling material 400 in FIGS. 17a, 17b and 17c may be conducted by several possible ways:

(1) Dispose a material with appropriate thickness and refractive index (n) by vacuum deposition/evaporation to reduce the dip depth of the concave area. The selective deposition/evaporation of the index-matching capping/filling material layer may be conducted through a shadow mask to define its area/pattern/range.

(2) Selectively dispose liquid or gel-state index-matching fluid/oil, adhesive, gel, resin, encapsulation material etc. to fill the concave area. If necessary, solidify these index-matching filling materials by subsequent curing. The selective disposition of these liquid or gel-state index-matching capping/filling materials may be conducted by ink-jet printing to define its area/pattern/range and to control the filling material amount and filling thickness.

Figure 18A:
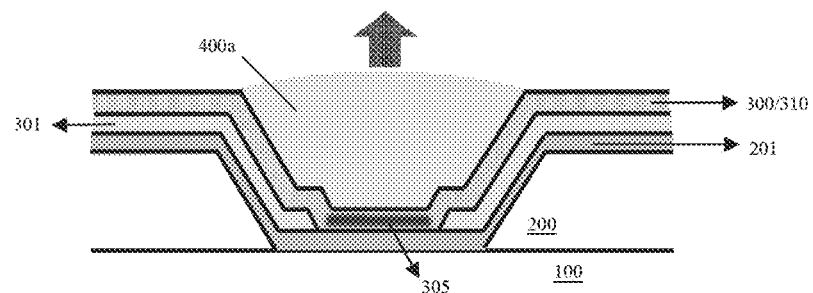
FIGS. 18a, 18b and 18c. Several other possible embodiments of top-emitting OLEDs having the concave and optically reflective structure.
Figure 18B:
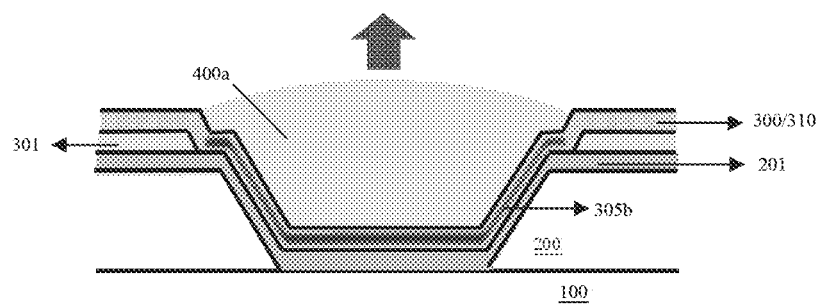
Figure 18C:
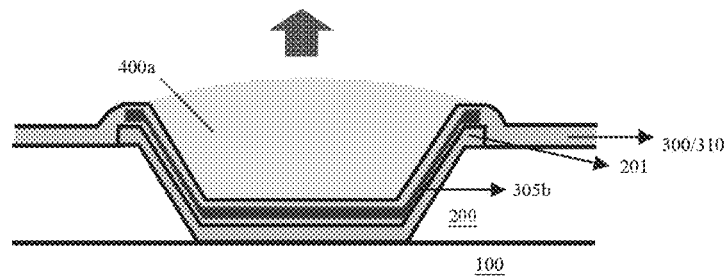

If the index-matching filling materials applied to the concave area are liquid or gel, one may further make use of their surface tension to make the surface of the index-matching material layer curved or non-planar (e.g., lens-like surface profile), as illustrated in FIGS. 18a, 18b and 18c. It may benefit direct out-coupling of OLED emission or reduce of the number of reflections (and corresponding optical loss)

before being out-coupled, further enhancing optical out-coupling efficiency of OLEDs.

Figure 19:
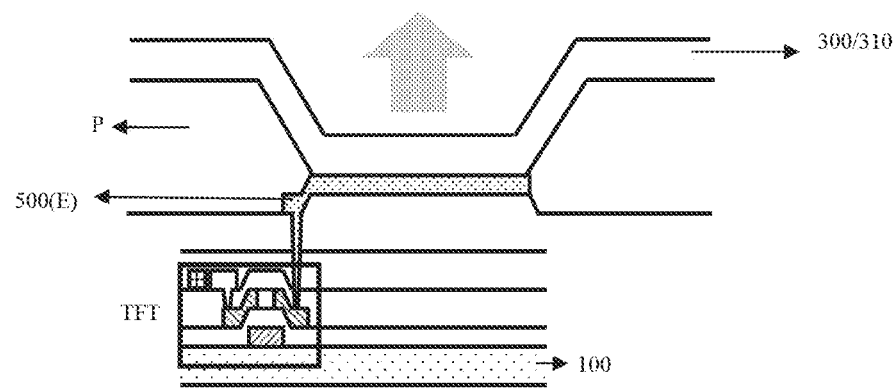
FIG. 19. The schematic integration structure for the pixel of a current and typical top-emitting AMOLED.

Embodiment Example 3: Top-Emitting Active Matrix OLED Display (Top-Emitting AMOLED) Having the Optically Reflective Concave Structure FIG. 19 shows the schematic integration structure for the pixel of a top-emitting AMOLED. It has a pixel definition layer-PDL P (or planarization & interlayer) of an appropriate thickness, which has tapered opening for defining the pixel OLED emission area and also serves to planarize surface corrugation caused by TFTs/electrode bus lines/interconnection/other structures of the backplane below.

Figure 20A:
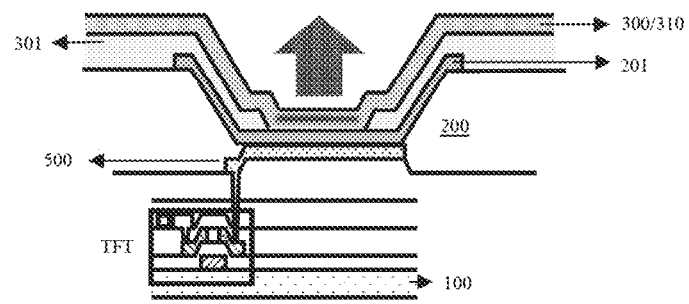
FIGS. 20a, 20b and 20c. Several possible embodiments of top-emitting AMOLEDs having the concave and optically reflective structure for the pixel OLED.
Figure 20B:
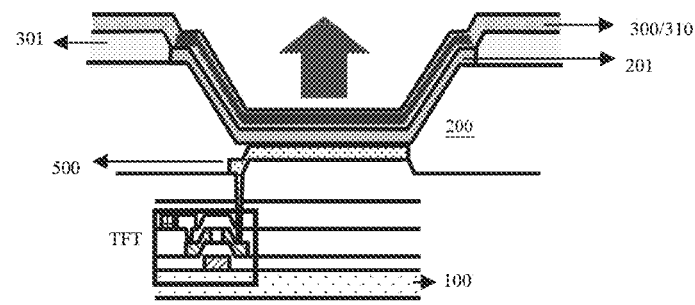
Figure 20C:
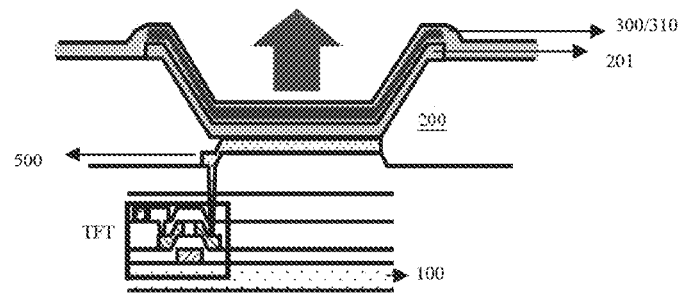
Figure 21A:
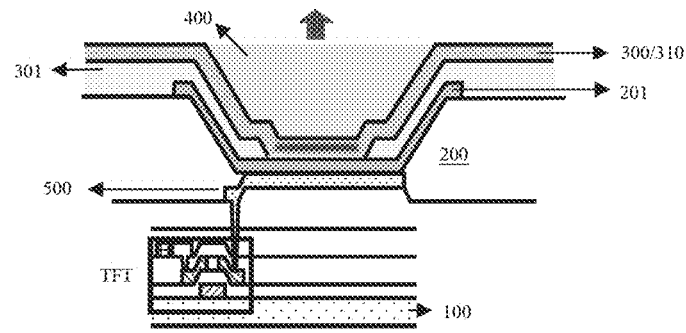
FIGS. 21a, 21b and 21c. Several possible embodiments of top-emitting AMOLEDs having the concave and optically reflective structure for the pixel OLED with the flat surface of the index-matching filling material/layer.
Figure 21B:
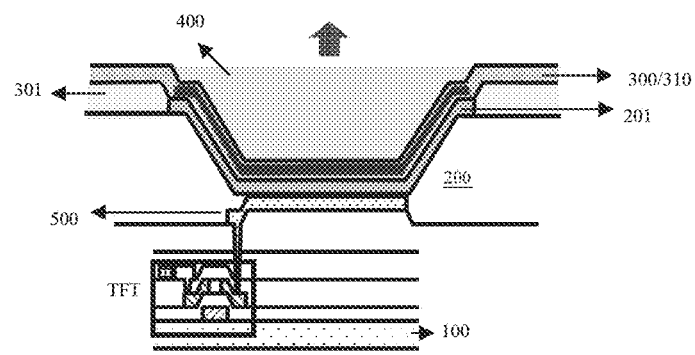
Figure 21C:
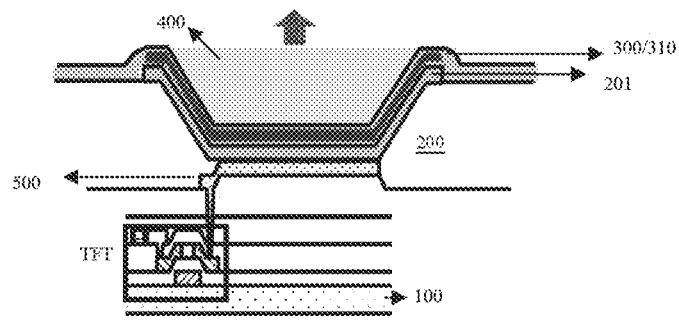
Figure 22A:
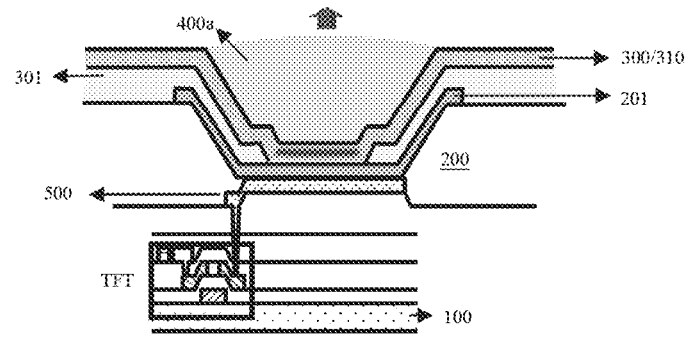
FIGS. 22a, 22b and 22c. Several possible embodiments of top-emitting AMOLEDs having the concave and optically reflective structure for the pixel OLED with the curved/non-flat surface of the index-matching filling material/layer.
Figure 22B:
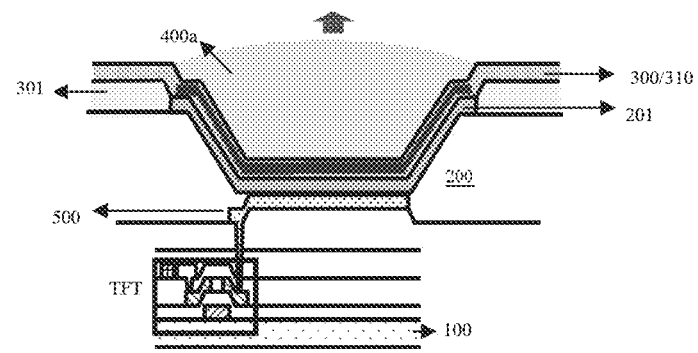
Figure 22C:
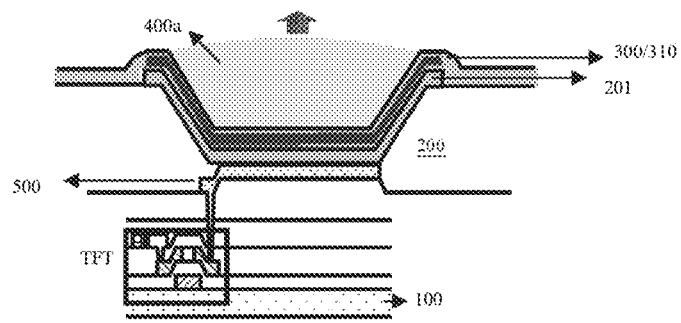

FIG. 19 shows that there is a concave structure in the AMOLED pixel OLED structure. By using such a concave structure in the AMOLED pixel OLED structure, by forming patterned reflective electrode E over the surface of the concave structure, and by making its electrical contact to the TFT interconnection 500 beneath, OLED pixels having the concave and optically reflective structure can be formed. By adding one or two more photo-mask processing steps in the AMOLED fabrication, various top-emitting AMOLED architectures having the concave and optically reflective structure 200(201), as shown in FIG. 20a, 20b, 20c, can be implemented. In the structure of FIG. 20a, the OLED emission area is defined at the planar bottom of the concave structure 200 (i.e., with planar OLED emission zone) by the patterned opening in the emission-zone definition layer 301. Meanwhile in the structures of FIGS. 20b and 20c, the OLED emission area is extended to the side slopes till the top edge of the concave area (i.e., with non-planar OLED emission zone), as defined by the patterned opening in the emission-zone definition layer 301 or the patterned reflective electrode 201 over the surface of the concave structure 200. In disposing OLED functional layers 300 including the top (semi) transparent electrode 310, if more than one emitting layers/units are disposed in the layer structure, then multiple emission zones may be formed and stacked in the concave and optically reflective structure 200.

Embodiment Example 4: Top-Emitting Active Matrix OLED Display (Top-Emitting AMOLED) Having the Optically Reflective Concave Structure with the Flat or Curved Exposed Surface of the Index-Matching Material With the structures shown in FIG. 20a, 20b, 20c as the basis, a relatively transparent material 400/400a (referred as the index-matching filling material) having a refractive index similar to those of the OLED emission layer(s)/emission zone can be further disposed over the OLED functional layers 300/310 within the concave area to fill or nearly fill the concave and optically reflective structure 200/201, forming the structures shown in FIG. 21a, 21b, 21c or FIG. 22a, 22b, 22c. In disposing OLED functional layers 300/310, if more than one emitting layers/units are disposed in the layer structure, then multiple emission zones may be formed and stacked in the concave and optically reflective structure 200/201.

Figure 23A:
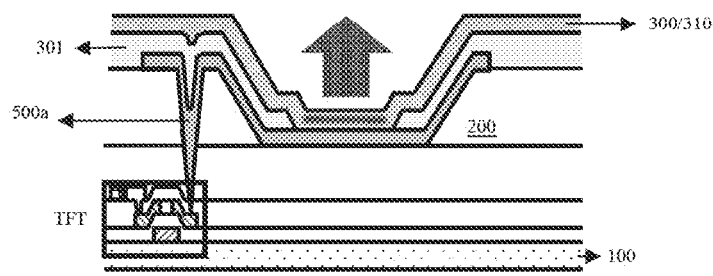
FIGS. 23a, 23b and 23c. Various top-emitting AMOLEDs having the concave and optically reflective structure and having the bottom reflective electrode (and also the optically reflective coating over the concave area) of the pixel OLED also serve as the interconnection conductor with the driving TFT below.
Figure 23B:
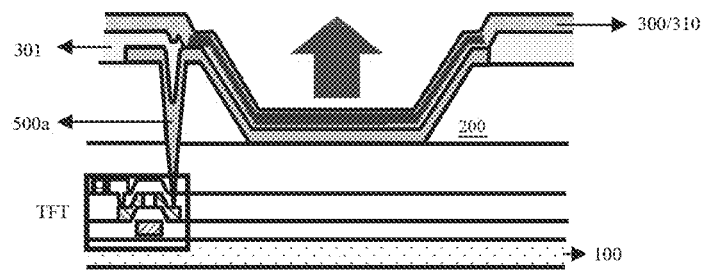
Figure 23C:
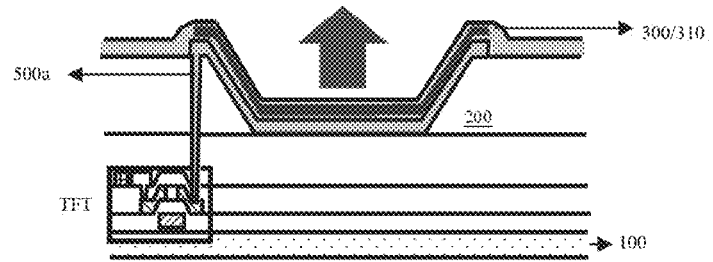
Figure 24A:
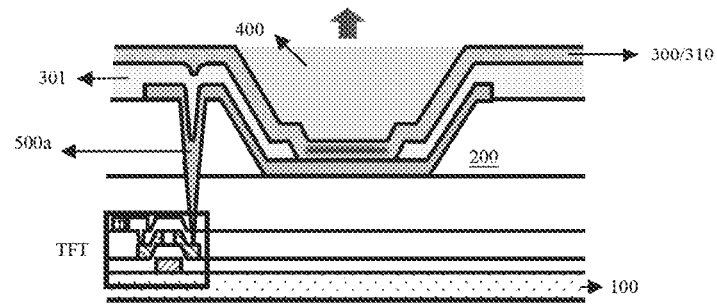
FIGS. 24a, 24b and 24c. Various top-emitting AMOLEDs having the concave and optically reflective structure and having the bottom reflective electrode (and also the optically reflective coating over the concave area) of the pixel OLED also serve as the interconnection conductor with the driving TFT below and the top surface of the index-matching filling material/layer is flat.
Figure 24B:
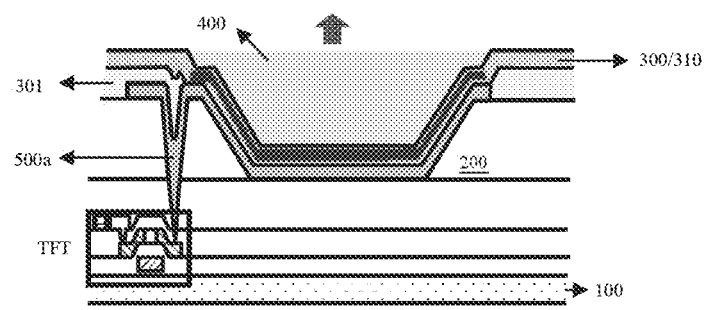
Figure 24C:
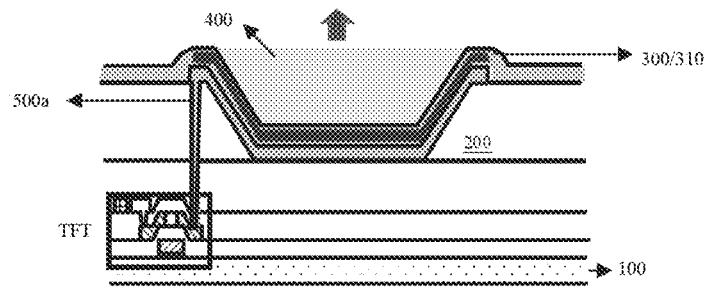
Figure 25A:
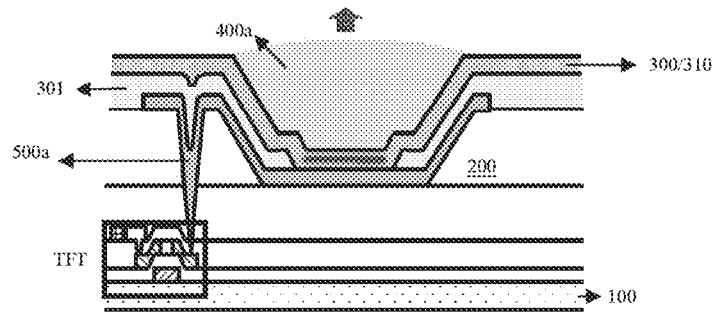
FIGS. 25a, 25b and 25c. Various top-emitting AMOLEDs having the concave and optically reflective structure and having the bottom reflective electrode (and also the optically reflective coating over the concave area) of the pixel OLED also serve as the interconnection conductor with the driving TFT below and the top surface of the index-matching filling material/layer is curved/non-flat.
Figure 25B:
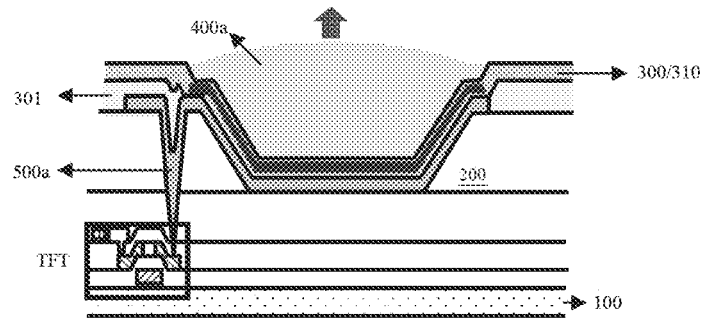
Figure 25C:
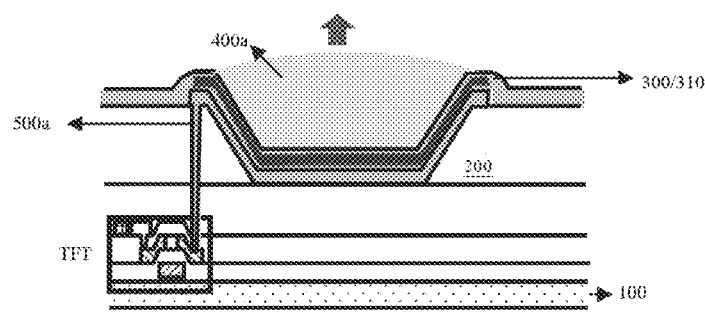

Embodiment Example 5: Top-Emitting Active Matrix OLED Display (Top-Emitting AMOLED) Having the Optically Reflective Concave Structure With the structures shown in FIGS. 20a, 20b, 20c as the basis, through appropriate patterning and opening in the concave structure layer and layers beneath, the bottom reflective electrode (and also the optically reflective coating over the concave area 200) of the pixel OLED can also serve as the interconnection conductor 500a with the TFT below, forming various top-emitting AMOLED architectures having the concave and optically reflective structure 200 as shown in FIGS. 23a, 23b, 23c. In the structure of FIG. 23a, the OLED emission area is defined at the planar bottom of the concave structure 200 (i.e., with planar OLED emission zone) by the patterned opening in the emission-zone definition layer 301. Meanwhile in the structures of FIGS. 23b and 23c, the OLED emission area is extended to the side slopes till the top edge of the concave area (i.e., with non-planar OLED emission zone), as defined by the patterned opening in the emission-zone definition layer 301 or the patterned reflective electrode over the surface of the concave structure 200. In disposing OLED functional layers 300 including the semi-transparent or transparent top electrode 310, if more than one emitting layers/units are disposed in the layer structure, then multiple emission zones may be formed and stacked in the concave and optically reflective structure 200.

Embodiment Example 6: Top-Emitting Active Matrix OLED Display (Top-Emitting AMOLED) Having the Optically Reflective Concave Structure with the Flat or Curved Exposed Surface of the Index-Matching Material With the structures shown in FIGS. 23a, 23b, 23c as the basis, a relatively transparent material 400/400a (referred as the index-matching filling material) having a refractive index similar to those of the OLED emission layer(s)/emission zone can be further disposed over the OLED functional layers within the concave area to fill or nearly fill the concave and optically reflective structure, forming the structures shown in FIGS. 24a, 24b, 24c or FIG. 25a, 25b, 25c. In disposing OLED functional layers, if more than one emitting layers/units are disposed in the layer structure, then multiple emission zones may be formed and stacked in the concave and optically reflective structure.

Embodiment of the Optically Reflective Concave Structure: Material of the First Surface is Different from that of the Second Surface In addition to several possible types of the concave and optically reflective structures illustrated in FIGS. 12a, 12b and 12c, several more possible concave and optically reflective structures that combine different reflective material layers are illustrated in FIGS. 26a, 26b and 26c.

Figure 26A:
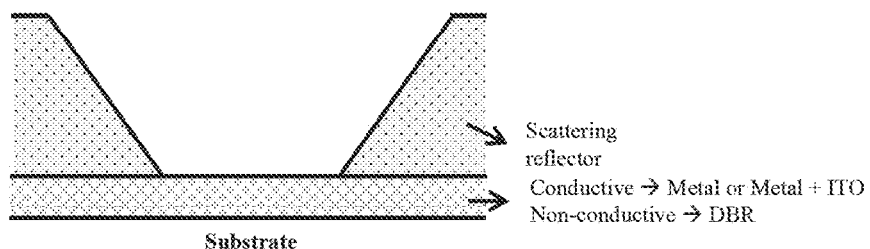
FIGS. 26a, 26b and 26c. Several more possible concave and optically reflective structures that combine different reflective material layers.

The first type, which is shown in FIG. 26a, is formed by first disposing a highly optically reflective material layer(s) over the substrate and then forming a concave structure layer on such a highly reflective layer with a material having strong optical scattering reflection. The highly optically reflective material layer(s) over the substrate could be conductive material like Al, Ag, Al:Ag alloys, their stacks or material stacks of transparent conductor like indium tin oxide (ITO), indium zinc oxide (IZO), aluminum zinc oxide (AZO), gallium zinc oxide (GZO) over the Al (Ag, Al:Ag alloys, Ag/Al stacks). The highly optically reflective material layer(s) over the substrate could also be dielectric DBR.

Figure 26B:
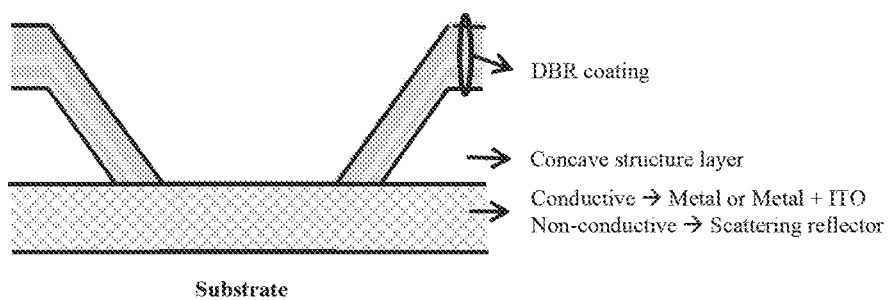

The second type, which is shown in FIG. 26b, is formed by first disposing a highly optically reflective material layer(s) over the substrate, forming a concave structure layer on such a highly reflective layer, and then disposing (and patterning) appropriate combinations of transparent dielectric layers having high reflection, such as the distributed Bragg reflector formed by alternate stacking of high-index/low-index materials (e.g., ITO/SiO$_2$, TiO$_2$/SiO$_2$, Ta$_2$O$_5$/SiO$_2$ etc.), over the concave structure side slopes. The highly optically reflective material layer(s) over the substrate could be conductive material like Al, Ag, Al:Ag alloys, their stacks or material stacks of transparent conductor like indium tin oxide (ITO), indium zinc oxide (IZO), aluminum zinc oxide (AZO), gallium zinc oxide (GZO) over the Al (Ag, Al:Ag alloys, Ag/Al stacks). The highly optically reflective material layer(s) over the substrate could also be a highly reflective layer with a material having strong optical scattering reflection.

Figure 26C:
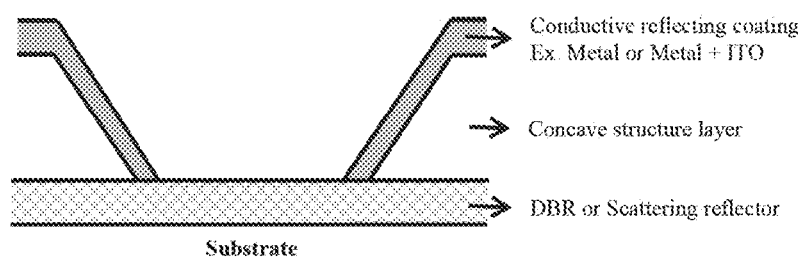

The third type, which is shown in FIG. 26c, is formed by first disposing a highly optically reflective material layer(s) over the substrate, forming a concave structure layer on such a highly reflective layer, and then disposing (and patterning) highly optically reflective and conductive layer(s) over the side slopes of the concave structure. The highly optically reflective layer over the substrate could be the distributed Bragg reflector formed by alternate stacking of high-index/low-index materials (e.g., ITO/SiO$_2$, TiO$_2$/SiO$_2$, Ta$_2$O$_5$/SiO$_2$ etc.). The highly optically reflective material layer(s) over the substrate could also be a highly reflective layer with a material having strong optical scattering reflection. The highly optically reflective and conductive material layer(s) over the side slopes of concave structures could be conductive material like Al, Ag, Al:Ag alloys, their stacks or material stacks of transparent conductor like indium tin oxide (ITO), indium zinc oxide (IZO), aluminum zinc oxide (AZO), gallium zinc oxide (GZO) over the Al (Ag, Al:Ag alloys, Ag/Al stacks).

Below, using the concave and optically reflective structure of FIG. 26a, two embodiment examples of top-emitting OLEDs and two embodiment examples of top-emitting AMOLEDs having the concave and optically reflective structures are described. With slight modification of the processing and processing flows of these embodiment examples, top-mitting OLEDs and top-emitting AMOLEDs having the concave and optically reflective structures of FIG. 26b and FIG. 26c can also be readily implemented.

Figure 27A:
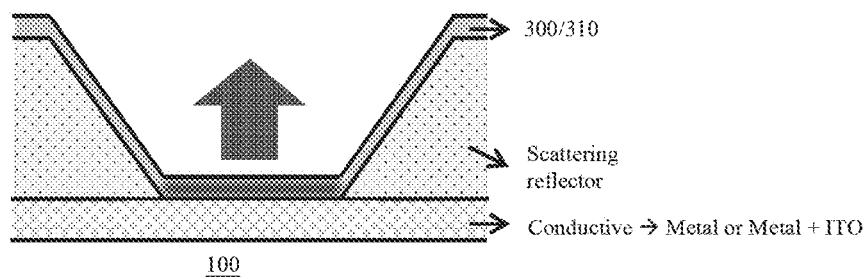
Figure 27B:
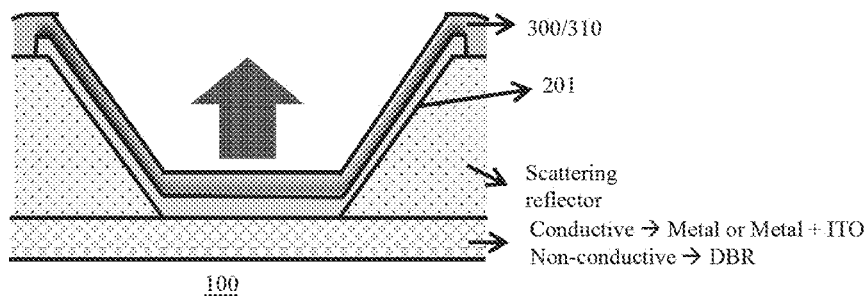

Embodiment Example 7: OLED Having the Optically Reflective Concave Structure FIGS. 27a, 27b illustrate possible embodiments of top-emitting OLEDs having the concave and optically reflective structure, including the structure with the OLED emission zone within the concave area in FIG. 27a and the structure with the OLED emission zone extending to the top edge of the concave area in FIG. 27b. In these OLED structures, the concave and optically reflective structures are first formed on a substrate 100. Then, various functional layers 300 of the OLED, such as emission layer(s), charge transport layer(s), electrode layer(s), and passivation/capping layer(s) 310 etc. that typically have refractive indices higher than that of air, are disposed over surface of the concave and optically reflective structure, forming OLED emission zones inside the concave area, as shown in FIG. 27a, or forming OLED emission zones that extend to the top edge of the concave area, as shown in FIG. 27b. In disposing OLED functional layers, if more than one emitting layers/units are disposed in the layer structure, then multiple emission zones may be formed and stacked in the concave and optically reflective structure.

Figure 28A:
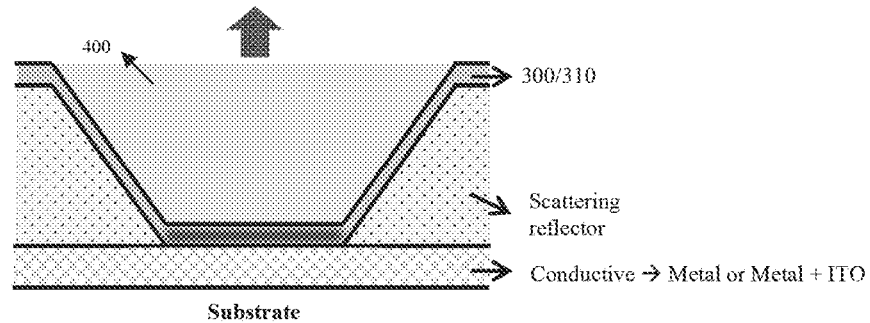
FIGS. 28a and 28b. Possible embodiments of top-emitting OLEDs having the concave and optically reflective structure based on FIG. 26a and the top surface of the index-matching filling material/layer is flat.
Figure 28B:
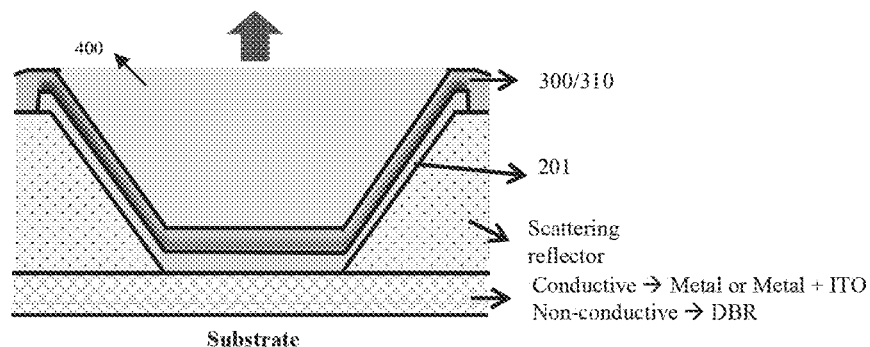

Embodiment Example 8: OLED Having the Optically Reflective Concave Structure with the Flat or Curved Exposed Surface of the Index-Matching Material FIGS. 28a and 28b illustrate possible embodiments of top-emitting OLEDs having the concave and optically reflective structure, including the structure with the OLED emission zone within the concave area in FIG. 28a and the structure with the OLED emission zone extending to the top edge of the concave area in FIG. 28b. Their structures and possible fabrication are similar to those shown in FIGS. 27a, 27b and FIG. 14, and yet a relatively transparent material 400/400a (referred as the index-matching filling material) having a refractive index similar to those of the OLED emission layer(s)/emission zone is further disposed over the OLED functional layers 300/310 within the concave area to fill or nearly fill the concave and optically reflective structure. Filling the index-matching material 400/400a can increase the overall thickness of functional layers within the concave and optically reflective area and reduce the number of reflection (and corresponding optical loss) of the reflected or total internal reflected light before being re-directed by the concave and optically reflective structure for optical out-coupling. In disposing OLED functional layers, if more than one emitting layers/units are disposed in the layer structure, then multiple emission zones may be formed and stacked in the concave and optically reflective structure.

Figure 29A:
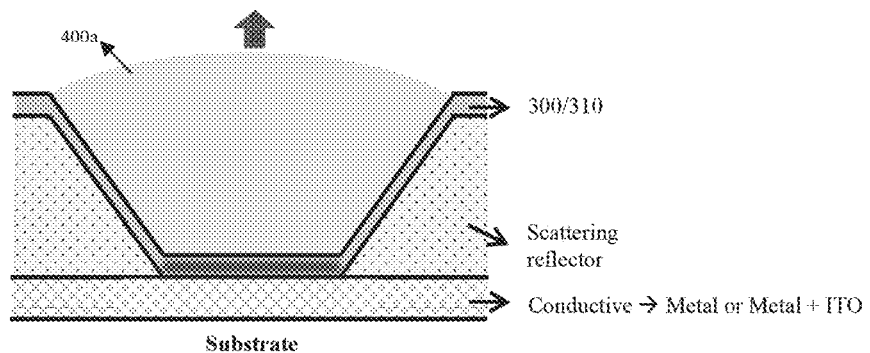
FIGS. 29a and 29b. Possible embodiments of top-emitting OLEDs having the concave and optically reflective structure based on FIG. 26a and the top surface of the index-matching filling material/layer is curved/non-flat.
Figure 29B:
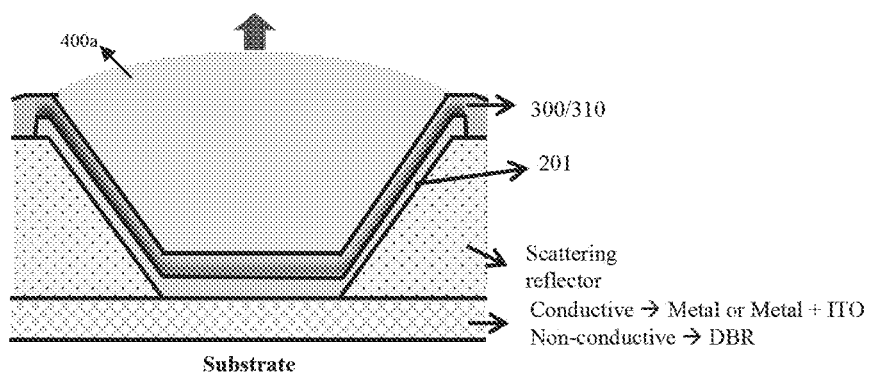

If the index-matching filling materials applied to the concave area are liquid or gel, one may further make use of their surface tension to make the surface of the index-matching material layer curved or non-planar (e.g., lens-like surface profile), as illustrated in FIGS. 29a and 29b. It may benefit direct out-coupling of OLED emission or reduce of the number of reflections (and corresponding optical loss) before being out-coupled, further enhancing optical out-coupling efficiency of OLEDs.

Figure 30A:
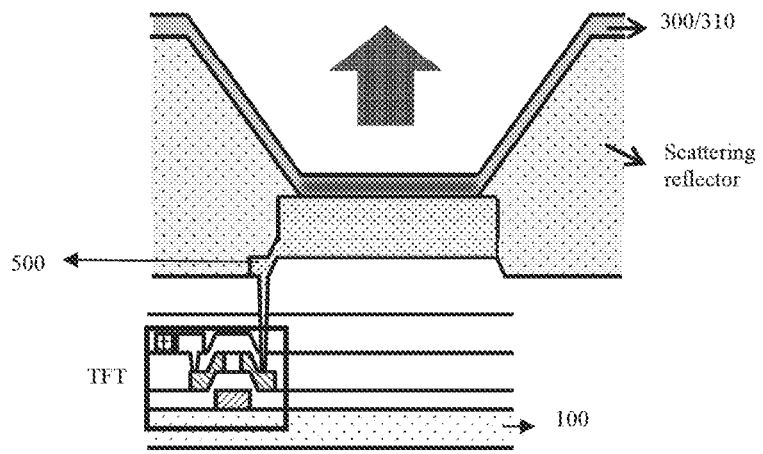
FIGS. 30a and 30b. Several possible embodiments of top-emitting AMOLEDs having the concave and optically reflective structure for the pixel OLED, based on the structures of FIGS. 27a-27b.
Figure 30B:
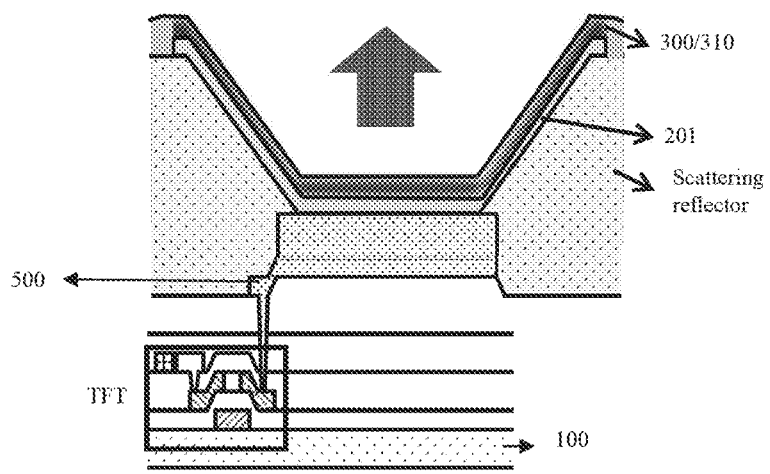
Figure 31A:
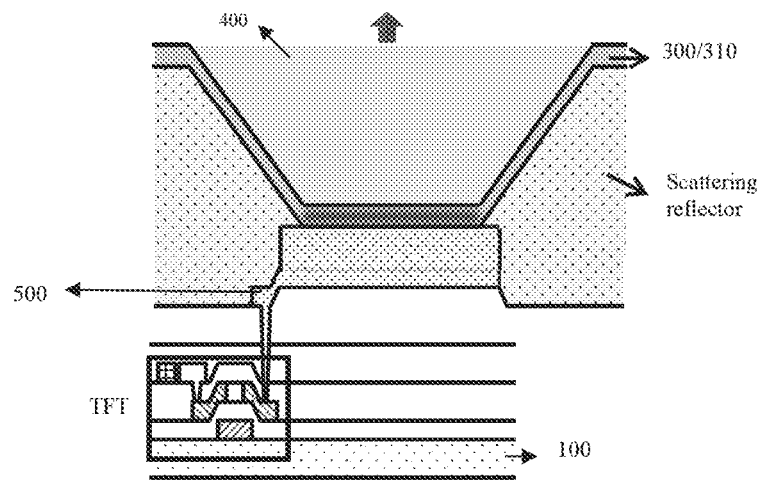
FIGS. 31a and 31b. Several possible embodiments of top-emitting AMOLEDs having the concave and optically reflective structure for the pixel OLED, based on the structures of FIGS. 27a-27b, and the top surface of the index-matching filling material/layer is flat.
Figure 31B:
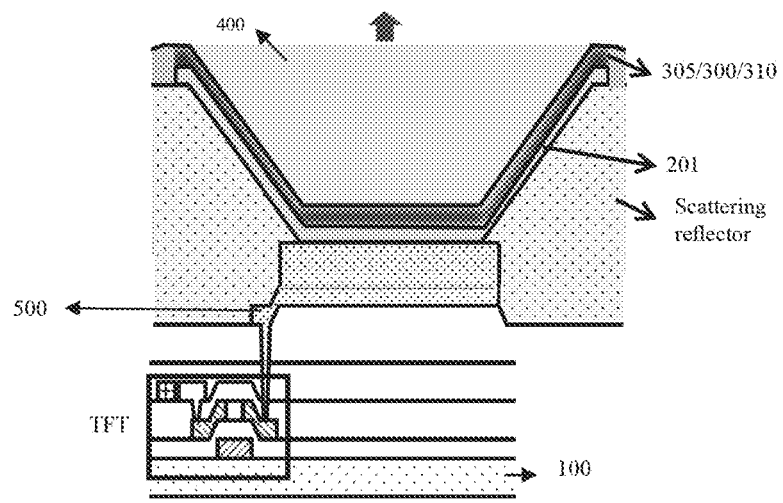
Figure 32A:
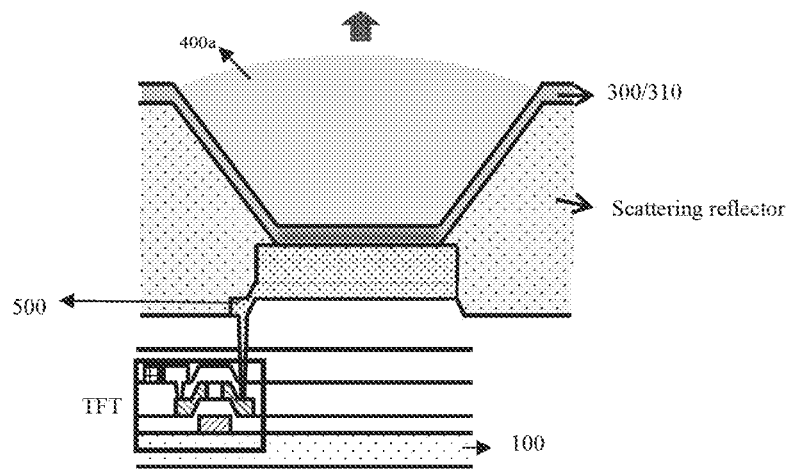
FIGS. 32a and 32b. Several possible embodiments of top-emitting AMOLEDs having the concave and optically reflective structure for the pixel OLED, based on the structures of FIGS. 27a-27b, and the top surface of the index-matching filling material/layer is curved/non-flat.
Figure 32B:
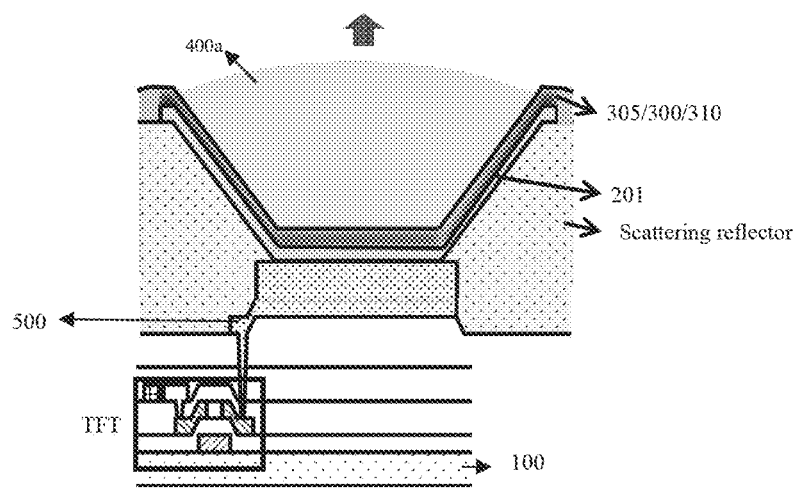

Embodiment Example 9: Top-Emitting Active Matrix OLED Display (Top-Emitting AMOLED) Having the Optically Reflective Concave Structure With the structure shown in FIG. 27a as the basis, possible embodiments of top-emitting AMOLED structures containing pixel OLEDs having the concave and optically reflective structure are shown in FIG. 30. In the structure of FIG. 30a, the OLED emission zone is within the concave area; in the structure of FIG. 30b, the OLED emission zone extends to the side slopes and the top edge of the concave area, forming non-planar OLED emission zones. In disposing OLED functional layers, if more than one emitting layers/units are disposed in the layer structure, then multiple emission zones may be formed and stacked in the concave and optically reflective structure.

Embodiment Example 10: Top-Emitting Active Matrix OLED Display (Top-Emitting AMOLED) Having the Optically Reflective Concave Structure with the Flat or Curved Exposed Surface of the Index-Matching Material With the structures shown in FIGS. 30a, 30b as the basis, a relatively transparent material (referred as the index-matching filling material) having a refractive index similar to those of the OLED emission layer(s)/emission zone can be further disposed over the OLED functional layers within the concave area to fill or nearly fill the concave and optically reflective structure, forming the structures shown in FIGS. 31a, 31b or FIGS. 32a, 32b. In disposing OLED functional layers, if more than one emitting layers/units are disposed in the layer structure, then multiple emission zones may be formed and stacked in the concave and optically reflective structure.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. An organic electroluminescent device, comprising:
    an optically reflective concave structure, comprising:
        a first optically reflective surface; and
        a second optically reflective surface, intersecting said first optically reflective surface at an obtuse angle;
    a first light propagation layer in direct contact with said first optically reflective surface and said second optically reflective surface, comprising:
        a first refractive surface, parallel to and separated from said first optically reflective surface;
        a second refractive surface, parallel to and separated from said second optically reflective surface; and
        an electroluminescent area, disposed entirely within said first light propagation layer, between said first optically reflective surface and said first refractive surface, without directly contacting any of said first optically reflective surface, said second optically reflective surface, said first refractive surface and said second refractive surface; and
    a second light propagation layer, disposed on the first light propagation layer, wherein said second light propagation layer has a greater refractive index than said electroluminescent area minus 0.2.

2. The organic electroluminescent device of claim 1, wherein said electroluminescent area is defined by a patterned interlayer.

3. The organic electroluminescent device of claim 1, wherein said first light propagation layer further comprises a bend at the obtuse angle, and light emitted from the electroluminescent area propagating through said first light propagation layer is re-directed and out-coupled to air by the bend.

4. The organic electroluminescent device of claim 1, wherein said first light propagation layer further comprises:
    a first portion, having a first thickness, and disposed over the first optically reflective surface; and
    a second portion, having a second thickness less than said first thickness, and disposed over the second optically reflective surface,
    wherein light emitted from the electroluminescent area propagating from the first portion to the second portion is re-directed and out-coupled to air by the decrease in thickness from the first thickness to the second thickness.

5. The organic electroluminescent device of claim 1, wherein the ratio between a diameter of the first optically reflective surface and a thickness of the first light propagation layer is smaller than 200.

6. The organic electroluminescent device of claim 1, wherein the ratio between a diameter of the first optically reflective surface and a combined thickness of the first light propagation layer and the second light propagation layer is smaller than 60.

7. The organic electroluminescent device of claim 1, wherein the light emitted from the electroluminescent area is re-directed and out-coupled to air, and the number of reflection of the reflected or total internal reflected light and corresponding optical loss is reduced before being re-directed and out-coupled, when propagating in the first light propagation layer and second light propagation layer.

8. The organic electroluminescent device of claim 1, wherein the first light propagation layer and the second light propagation layer have a transparency of more than 75% in the wavelength range of the light emitted from the electroluminescent area.

9. The organic electroluminescent device of claim 1, wherein the exposed surface of the second light propagation layer is flat or curved.

10. The organic electroluminescent device of claim 1, wherein the optically reflective concave structure consists of a material selected from the group consisting of metal and scattering reflector.

11. The organic electroluminescent device of claim 1, wherein the optically reflective concave structure is made of a material selected from the group consisting of metal, transparent conductive metal-oxide, transparent dielectric, scattering reflector, distributed Bragg reflector formed by alternate stacking of high-index/low-index materials, their stacking and their combinations.

12. The organic electroluminescent device of claim 1, wherein a material of the first optically reflective surface is same as a material of the second optically reflective surface.

13. The organic electroluminescent device of claim 1, wherein a material of the first optically reflective surface is different from a material of the second optically reflective surface.

14. The organic electroluminescent device of claim 1, wherein the optically reflective concave structure further comprises a third surface adjoining said second optically reflective surface and parallel to said first optically reflective surface, and the electroluminescent area is extended to the intersection of the second and third surfaces.

15. The organic electroluminescent device of claim 1, wherein the first optically reflective surface and the second optically reflective surface have an optical reflectance greater than 80% in the wavelength range of the light emitted from the electroluminescent area.

16. A display including said organic electroluminescent device of claim 1, comprising:
    a substrate;
    a thin-film transistor, formed on the substrate; and
    an interconnection conductor, electrically connected to the thin-film transistor,
    wherein said electroluminescent device electrically connects to the interconnection conductor via the first optically reflective surface.

17. The display of claim 16, wherein the interconnection conductor also serves as the first optically reflective surface.

18. The display of claim 16, wherein said first optically reflective surface and said second optically reflective surface are non-conductive, and said first light propagation layer includes a first electrode electrically connected to the interconnection conductor.

19. A display including said organic electroluminescent device of claim 1, comprising:
    a substrate;
    a thin-film transistor formed on the substrate; and
    an interconnection conductor, electrically connected to the thin-film transistor, wherein said electroluminescent device electrically connects to the interconnection conductor via a third surface of the optically reflective concave structure adjoining said second optically reflective surface and parallel to said first optically reflective surface.

20. The display of claim 19, wherein the interconnection conductor also serves as the first optically reflective surface and the second optically reflective surface.

21. The organic electroluminescent device of claim 1, wherein the electroluminescent area emits light directly to said first optically reflective surface as bottom-emitting, and emits light directly to said first refractive surface as top-emitting.

22. The organic electroluminescent device of claim 1, further comprising a waveguide for directing light.

* * * * *